US010167193B2

(12) United States Patent
Rosenthal et al.

(10) Patent No.: US 10,167,193 B2
(45) Date of Patent: Jan. 1, 2019

(54) FERROELECTRIC AGGLOMERATES AND METHODS AND USES RELATED THERETO

(71) Applicant: Vanderbilt University, Nashville, TN (US)

(72) Inventors: Sandra J. Rosenthal, Nashville, TN (US); Toshia Wrenn, La Vergne, TN (US)

(73) Assignee: Vanderbilt University, Nashville, TN (US)

( * ) Notice: Subject to any disclaimer, the term of this patent is extended or adjusted under 35 U.S.C. 154(b) by 378 days.

(21) Appl. No.: 14/863,388

(22) Filed: Sep. 23, 2015

(65) Prior Publication Data

US 2016/0087191 A1 Mar. 24, 2016

Related U.S. Application Data

(60) Provisional application No. 62/054,306, filed on Sep. 23, 2014.

(51) Int. Cl.
*B82Y 30/00* (2011.01)
*H01B 1/00* (2006.01)
*H01B 1/22* (2006.01)
*C01B 19/00* (2006.01)
*H01L 41/18* (2006.01)

(52) U.S. Cl.
CPC ............ *B82Y 30/00* (2013.01); *C01B 19/007* (2013.01); *H01L 41/18* (2013.01)

(58) Field of Classification Search
CPC ............ H01B 1/00; H01B 1/22; B82Y 30/00
See application file for complete search history.

(56) References Cited

U.S. PATENT DOCUMENTS

| 7,510,638 | B2 * | 3/2009 | Herman ................. B82Y 30/00 204/490 |
| 8,153,470 | B2 | 4/2012 | Lieber et al. |
| 8,558,214 | B2 | 10/2013 | Hahn |
| 2010/0167512 | A1 | 7/2010 | Pan et al. |
| 2011/0133175 | A1 | 6/2011 | Ryu et al. |
| 2012/0145212 | A1 | 6/2012 | Purkayastha et al. |
| 2012/0235080 | A1 | 9/2012 | Hong et al. |
| 2012/0329686 | A1 | 12/2012 | Tenne et al. |
| 2013/0140505 | A1 | 6/2013 | Rowe et al. |
| 2013/0240871 | A1 | 9/2013 | Shimoda et al. |

FOREIGN PATENT DOCUMENTS

| WO | WO-2012/111009 A2 | 8/2012 |
| WO | WO-2012/158847 A2 | 11/2012 |
| WO | WO-2013/002919 A1 | 1/2013 |

OTHER PUBLICATIONS

The motley family of polar compounds (MV)[M(X5-xX'x)] based on anionic chains of trans-connected M(III)(X,X')6 octahedra (M=Bi, Sb;X,X'=Cl, Br,I) and methylviologen (MV) dications, N. Leblanc et al., Journal of Solid State Chemistry 195 (2012) 140-148.*

Lead Halide Perovskites and Other Metal Halide Complexes As Inorganic Capping Ligands for Colloidal Nanocrystals, Dirin et al., J. Am. Chem. Soc. 2014, 136, 6550-6553. (Year: 2014).*

Dirin et al., Supporting Information. (Year: 2014).*

Alivisatos, A. P., Hexameric octahedral clusters of PbSe nanocrystals grown from amorphous lead(II) carboxylate nanoparticles, Chemistry of Materials. 25: 2544-2548.

Anderson, P. W., More is Different, Science 1972, 177 (4047), 393-396.

Atkuri, H; et al., Preparation of ferroelectric nanoparticlesfor their use in liquid crystalline colloids, J Opt A: Pure Appl Opt., 2009, 11, 024006.

Basun, S. A. et al., Phys. Rev. B: Condens. Matter Mater. Phys. 2011, 84, 024105/1-024105/8.

Beberwyck, B. J. et al., Cation Exchange: A Versitle Tool for Nanomaterials Synthesis, J Phys. Chem. C2013, 117, 19759-19770.

Bullen et al., Nucleation and growth kinetics of CdSe nanocrystals in octadecene, Nano Letters. vol. 4, No. 12, pp. 2303-2307, 2004.

Carrete, Alex et al., Antimony-Based Ligand Exchange to Promote Crystallization in Spray-Deposited Cu2ZnSNSe4 Solar Cells, J. Am Chem Soc, pp. 15982-15985, 2013; DOI: 10.1021/ja4068639.

Casavola, M. et al., Anisotropic Cation Exchange in PbSe/CdSe Core/Shell Nanocrystals of Different Geometry, Chem. Mater. 2012, 24 (2), 294-302.

Chang et al., Electrostatic and Sterical Stabilization of CuO Nanofluid Prepared by Vacuum Arc Spray Nanofluid Synthesis System, Materials Transactions, 50(8), 2009, 2098.

Chen et al., Enhancement of emission characteristics of cadmium-free ZCIS/ZnS/SiO2 quantum dots by Au nanoparticles, Appl. Phys. Lett. Jul. 2012, vol. 101, No. 4, pp. 041908.

Costas-Mora et al, Solid-state chemiluminescence assay for ultrasensitive detection of antimony using on-vial immobilization of CdSe quantum dots combined with liquid-liquid-liquid microextraction, Analytica Chimica Acta, 788, 2013, 114-121.

Dawar, R. et al., Thermodynamic characterization of chromium tellurate, Journal of Thermal Analysis and Calorimetry, Apr. 2013, vol. 112, Issue 1, pp. 95-102.

Dirin, D. N. et al., Lead halide perovskites and other metal halide complexes as inorganic capping ligands for colloidal nanocrystals, J. Am. Chem. Soc. 2014, 136, 6550-6553.

Garbovskiy, Y. et al., Emerging applications of ferroelectric nanoparticles in materials technologies, biology and medicine. InTech 2013, 475-497.

Garnett et al., Journal of Physical Chemistry C, vol. 112, pp. 12736-12746, 2008.

Hiramatsu et al., A Simple Large-Scale Synthesis of Nearly Monodisperse Gold and Silver Nanoparticles with Adjustable Sizes and with Exchangeable Surfactants, Chem. Mater., 2004, 16 (13), pp. 2509-2511.

Jain, P. K. et al., Nanoheterostructure cation exchange: anionic framework conservation, J. Am. Chem. Soc. 2010, 132 (29), 9997-9999.

(Continued)

*Primary Examiner* — Haidung D Nguyen
(74) *Attorney, Agent, or Firm* — Ballard Spahr LLP

(57) ABSTRACT

Disclosed herein are ferroelectric agglomerates and methods related thereto. In certain aspects, the ferroelectric agglomerates can be made from particles that have been treated with $SbX_3$ or $SbX_5$, wherein X is a halogen. This abstract is intended as a scanning tool for purposes of searching in the particular art and is not intended to be limiting of the present invention.

20 Claims, 30 Drawing Sheets

(56) References Cited

OTHER PUBLICATIONS

Jia, G. et al., Couples of colloidal semiconductor nanorods formed by self-limited assembly. Nat. Mater. 13, 301-307 (2014).
Joo et al., Generalized and facile synthesis of semiconducting metal sulfide nanocrystals, J. Am Chem Soc. Sep. 10, 2003;125(36):11100-5.
Kamat, P. V., Boosting the efficiency of quantum dot sensitized solar cells through modulation of interfacial charge transfer, Acc. Chem. Res. Nov. 20, 2012;45(11):1906-15.
Khanna, P. K. et al., One-pot synthesis of oleic acid-capped cadmium chalcogenides (CdE: E=Se,Te) nano-crystals., J. Nanopart. Res. 12:101-109, 2010.
Koktysh et al., EuS nanocrystals: a novel synthesis for the generation of monodisperse nanocrystals with size-dependent optical properties, Nanotechnology,2010, vol. 21, No. 41.
Koktysh et al., Facile route to SnS nanocrystals and their characterization, Materials Science and Engineering: B, vol. 170, Issues 1-3, Jun. 15, 2010, pp. 117-122.
Koktysh et al., Fluorescent magnetic hybrid nanoprobe for multimodal bioimaging, Nanotechnology, 2011. V.22. 275606.
Li, H. et al., Blue-UV-emitting ZnSe(dot)/ZnS(rod) core/shell nanocrystals prepared from CdSe/CdS nanocrystals by sequential cation exchange, ACS Nano 2012, 6 (2), 1637-1647.
Li, J. et al., Fluorescence signal amplification by cation exchange in ionic nanocrystals, Angew. Chem., Int. Ed. 2009, 48 (9), 1588-91.
Liu et al., Facile synthesis of monodisperse, size-tunable SnS nanoparticles potentially for solar cell energy conversion, Nanotechnology, 2010, 21, 105707.
Luby, S. et al. "Switching Phenomena in Amorphous Thin Films" Czech. J Phys. 1971,21, 878-89.
M. Hines and G. Scholes, Colloidal PbS nanocrystals with size-tunable Near-Infrared emission: observation of post-synthesis self-narrowing of the particle size distribution, Adv. Mater. 2003, 15, 1844-1849.
Masumdar, E. U. et al., Some studies on chemically synthesized antimony-doped CdSe thin films, Mater. Chem. Phys., 77 (3), 669-676, 2003.
Nann and Schneider, Origin of permanent electric dipole moments in wurtzite nanocrystals, Chem. Phys. Lett. vol. 384, Issues 1-3, Jan. 19, 2004, pp. 150-152.
O'Brien, et al., Morphological control and photoluminescence of zinc oxide nanocrystals, J Phys. Chem. B, 2005, 109 (30), pp. 14314-14318.
Owen, J. S. et al., Reaction chemistry and ligand exchange at cadmium-selenide nanocrystal surfaces, J. Am. Chem. Soc. 2008, 130, 12279-12281.
Polking, Mark J et al., Ferroelectric order in individual nanometre-scale crystals, Nature Materials, 2012, 11, 700-709.
Rai, Radheshyam et al., Structural and dielectric properties of Sb-doped PLZT ceramics, Ceramics International, 2004, 30, 1295.
Ricinschi, D. et al., First-principles study of tetragonality ratio and unit-cell volume influence on spontaneous polarization of $BaTiO_3$ and $PbTiO_3$, Zairyo 2006, 55, 169-172.
Rosenthal et al., Synthesis, Surface Studies, Composition and Structural Characterization of CdSe, Core/Shell, and Biologically Active Nanocrystals, Surf Sci. Rep., vol. 62, No. 4, pp. 111-157, 2007.
Schmidt, M. E. et al., Polar CdSe nanocrystals: Implications for electronic structure Journal of Chemical Physics. 106: 5254-5259.
Schreuder, et al., Control of Surface State Emission via Phosphonic Acid Modulation in Ultrasmall CdSe Nanocrystals: The Role of Ligand Electronegativity. J. Phys. Chem. C 2009, 113 (19), 8169-8176.
Schreuder, M.A. et al., White light-emitting diodes based on ultrasmall CdSe nanocrystal electroluminescence, Nano Lett. 2010, 10, 573-576.
Shaldin, Y. V. et al., Pyroelectric properties of the wide-gap CdSe semiconductor in the low-temperature region, Semiconductors 2014, 48, 1-8.
Solorzano et al., ICAM 2009 abstract.
Son, D. H. et al., Cation exchange reactions in ionic nanocrystals, Science. 2004, 306, 1009-1012.
Sun, X. et al., Self-Illuminating 64Cu-Doped CdSe/ZnS Nanocrystals for in Vivo Tumor Imaging, J. Am. Chem. Soc. 2014, 136, 1706-1709.
Susrutha B et al, Effects of gold nanoparticles on rheology of nano?uids containing poly(vinylidene fluoride) molecules, J Nano?uids 2012, 1:120-127.
Thanassoulas, Angelos et al., CdSe nanoparticles dispersed in ferroelectric smectic liquid crystals: Effects upon the smectic order and the smectic-A to chiral smectic-C phase transition, Phys Rev E, 2013, 88, 032504.
Torimoto et al., Remarkable photoluminescence enhancement of $ZnS$—$AgInS_2$ solid solution nanoparticles by post-synthesis treatment. Chem. Commun. 46(12):2082-2084, 2010.
Ung, T. D. T. et al., CdTe and CdSe quantum dots: synthesis, characterizations and applications in agriculture Adv. Nat. Sci.: Nanosci. Nanotechnol. 2012, 3 (043001), 11.
Vander Valk and Haas, C. Phys. Status Solidi B 1977, 80, 321-32.
Varghese, Justin et al., Ferroelectric nanoparticles, wires and tubes: synthesis, characterization and applications, J. Mater. Chem. C, 2013, 1, 2618.
Vongsavat, et al., Ultrasmall Hollow GoldSilver Nanoshells with Extinctions Strongly Red-Shifted to the Near-Infrared, ACS Appl. Mater. Interfaces 3, 3616-3624 (2011).
Wang, C. et al., Switchable diode effect and ferroelectric resistive switching in epitaxial $BiFeO_3$ thin filmsAppl. Phys. Lett. 2011, 98, 192901/1-192901/3.
Weiss, P. S., Mesoscale Science: Lessons from and Opportunities for Nanoscience, ACS Nano 2014, 8 (11), 11025-11026.
Weller, H. et al., Fluorescent Nanocrystals for Biomedical Applications, Z. Phys. Chem. 2014, 228, 183-192.
Xu, Y.; et al., Ferroelectrics, 1999, 230, 11-20.
Xue, et al., Plasmon-Driven Synthesis of Triangular Core-Shell Nanoprisms from Gold Seeds, Angewandte Chemie 2007, 119, 44 pp. 8588-8591.
Yadav, A. A. et al., "Compositional Analysis Studies of Chemically Synthesized Antimony Doped CdSe Thin Films." Chalcogenide Lett. 2008, 5, 405-414.
Ying, et al., Synthesis and Bio-Imaging Application of Highly Luminescent Mercaptosuccinic Acid-Coated CdTe Nanocrystals, PLoS ONE 3(5): e2222, 2008.
Yu et al., Luminescent gold nanoparticles with pH-dependent membrane adsorption, J.Am. Chem. Soc. 2011, 133, pp. 11014-11017.
Yu, W.W. et al., Experimental Determination of the Extinction Coefficient of CdTe, CdSe, and CdS Nanocrystals, Chem. Mater. 2003, 15, 2854-2860.
Zhang, H., Condens. Matter 2012, 1-18.
Zhong, et al., Synthesis of high-quality CdS, ZnS, and $ZnxCd1-xS$ nanocrystals using metal salts and elemental sulfur, J Mater. Chem. 2004, 14, pp. 2790-2794.
U.S. Appl. No. 61/925,121, filed Jan. 8, 2014, Rosenthal et al.
U.S. Appl. No. 62/054,306, filed Sep. 23, 2014, Rosenthal et al.

* cited by examiner

FERROELECTRIC AGGLOMERATES AND METHODS AND USES RELATED THERETO

CROSS-REFERENCE TO RELATED APPLICATIONS

This application claims the benefit of U.S. Provisional Application No. 62/054,306, filed on Sep. 23, 2014, which is incorporated herein fully by reference in its entirety.

STATEMENT REGARDING FEDERALLY SPONSORED RESEARCH

This invention was made with government support under grant nos. EPS 1004083 (TN-SCORE), DMR-0957701, and CHE 1213758 awarded by the National Science Foundation (NSF). The U.S. government has certain rights in the invention.

BACKGROUND

II-VI quantum dots (QDs) are of keen scientific interest due to their size-dependent optoelectronic properties, which make them viable candidates for a plethora of fields including biomedics (Weller, H. et al. (2014) *Z. Phys. Chem.* 228: 183-192.), solar power (Kamat, P. V. (2012) *Acc. Chem. Res.* 45: 1906-1915), LEDs, electronic displays (Schreuder, M. A. et al. (2010) *Nano Lett.* 10: 573-576), and agriculture (Ung, T. D. T. et al. (2012) *Adv. Nat. Sci.: Nanosci. Nanotechnol.* 3(043001): 11). Efforts to improve the effectiveness of QDs for these applications continue through the utilization of ligand exchanges (Owen, J. S. et al. (2008) *J. Am. Chem. Soc.* 130: 12279-12281), cation exchanges (Beberwyck, B. J. et al. (2013) *J. Phys. Chem. C* 117: 19759-19770), and doping (Sun, X. et al. (2014) *J. Am. Chem. Soc.* 136, 1706-1709).

Ferroelectrics belong to a subset of pyroelectrics, a division of piezoelectrics. Piezoelectrics possess a dynamic relationship between energy and crystal anisotropy; pyroelectrics exhibit a nonzero net polarization that changes with temperature. Ferroelectrics possess all the mentioned properties for both piezoelectrics and pyroelectrics, with the additional benefit of undergoing polarization reversal within an applied electric field. Thus, in addition to all of the applications for piezo- and pyroelectrics (Garbovskiy, Y. et al. (2013) *InTech* 475-497), ferroelectrics are also ideal for use in memory and electrochemical devices (Varghese, J. et al. (2013) *J. Mater. Chem. C* 1: 2618-2638), including, for example, non-volatile digital memories, thin film capacitors, electronic transducers, actuators, high-k dielectrics, pyroelectric sensors, electrooptic modulators, optical memories, and nonlinear optics.

Despite the wide range of applications, there remains a scarcity of microscale and nanoscale ferroelectric materials. Accordingly, disclosed herein are ferroelectric agglomerates and methods of producing and using same.

SUMMARY OF THE INVENTION

In accordance with the purpose(s) of the invention, as embodied and broadly described herein, the invention, in one aspect, relates to ferroelectric agglomerates and methods of producing and using same.

Disclosed herein is a method of producing a ferroelectric agglomerate comprising a) providing a particle comprising a particle body and a surface ligand; and b) treating the particle with a composition comprising $SbX_3$ or $SbX_5$, wherein X is a halogen.

Also disclosed herein is a ferroelectric agglomerate produced by the methods disclosed herein.

Also disclosed herein is a ferroelectric agglomerate comprising a particle, a matrix, and a surface ligand, wherein the particle comprises antimony and at least a first portion of a particle body, wherein the matrix comprises at least a second portion of particle body and halogen.

Also disclosed herein is a ferroelectric agglomerate comprising $Sb_2Se_3$ and $CdCl_2$.

Also disclosed herein is a ferroelectric agglomerate comprising atoms of a particle body, Sb, and X, wherein X is a halogen.

Also disclosed herein are methods of using a ferroelectric agglomerate disclosed herein.

Also disclosed herein are articles comprising a ferroelectric agglomerate disclosed herein.

While aspects of the present invention can be described and claimed in a particular statutory class, such as the system statutory class, this is for convenience only and one of skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is in no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

BRIEF DESCRIPTION OF THE FIGURES

The accompanying Figures, which are incorporated in and constitute a part of this specification, illustrate several aspects and together with the description serve to explain the principles of the invention.

FIG. 1A shows the ferroelectric agglomerates at one location and FIG. 1B shows the ferroelectric agglomerates in a different location. The ferroelectric agglomerates are moved from the location shown in FIG. 1A to the location shown in FIG. 1B by moving the gloved finger along the side of the test tube.

FIG. 3A shows the high-angle annular dark-field (HAADF) image of ferroelectric agglomerates. FIG. 3B-3F shows Energy Dispersive Elemental Maps of Cd, Se, Sb, Cl, and the combination thereof respectively. FIG. 3G shows the high-angle annular dark-field (HAADF) image of ferroelectric agglomerates. FIG. 3B-3F shows Energy Dispersive Elemental Maps of Fe, O, Sb, Cl, and the combination thereof respectively.

Figure 1A:
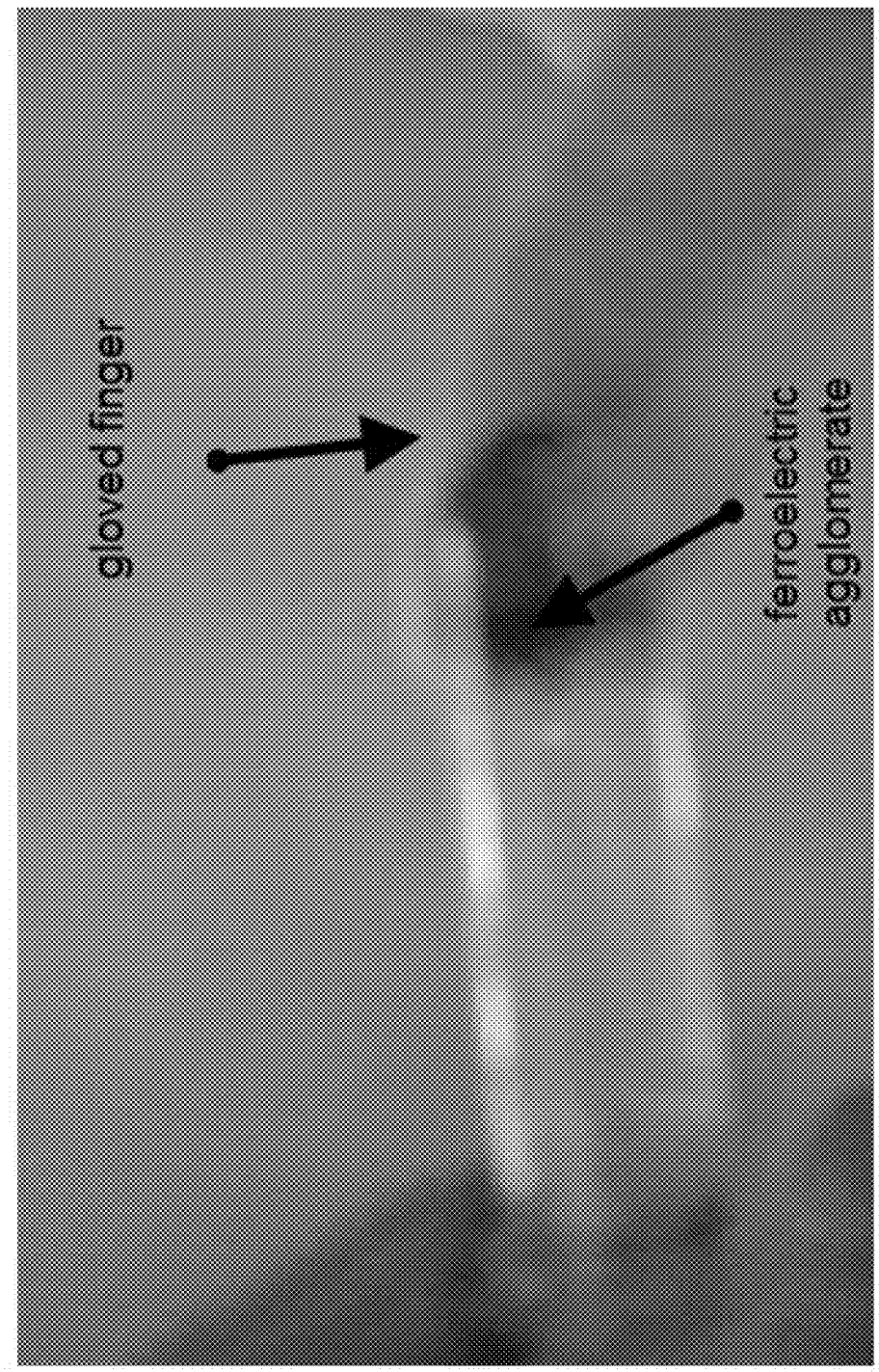
FIG. 1A and FIG. 1B show the susceptibility of ferroelectric agglomerates. The ferroelectric agglomerates can be moved within the solvent by moving a gloved finger along the side of the test tube thereby generating static electricity.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

A. Definitions

As used herein, nomenclature for compounds, including organic compounds, can be given using common names, IUPAC, IUBMB, or CAS recommendations for nomenclature. When one or more stereochemical features are present, Cahn-Ingold-Prelog rules for stereochemistry can be employed to designate stereochemical priority, E/Z specification, and the like. One of skill in the art can readily ascertain the structure of a compound if given a name, either by systemic reduction of the compound structure using naming conventions, or by commercially available software, such as CHEMDRAW™ (Cambridgesoft Corporation, U.S.A.).

As used in the specification and the appended claims, the singular forms "a," "an" and "the" include plural referents unless the context clearly dictates otherwise. Thus, for example, reference to "a functional group," "an alkyl," or "a residue" includes mixtures of two or more such functional groups, alkyls, or residues, and the like.

Ranges can be expressed herein as from "about" one particular value, and/or to "about" another particular value. When such a range is expressed, a further aspect includes from the one particular value and/or to the other particular value. Similarly, when values are expressed as approximations, by use of the antecedent "about," it will be understood that the particular value forms a further aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

The term "agglomerate" as used herein refers to a mass comprising one or more chemical compounds. Thus, the term "ferroelectric agglomerate" as used herein refers to a mass comprising one or more chemical compounds, wherein the mass possess ferroelectric properties.

A weight percent (wt. %) of a component, unless specifically stated to the contrary, is based on the total weight of the formulation or composition in which the component is included.

As used herein, the terms "optional" or "optionally" means that the subsequently described event or circumstance can or cannot occur, and that the description includes instances where said event or circumstance occurs and instances where it does not.

As used herein, the term "analog" refers to a compound having a structure derived from the structure of a parent compound (e.g., a compound disclosed herein) and whose structure is sufficiently similar to those disclosed herein and based upon that similarity, would be expected by one skilled in the art to exhibit the same or similar activities and utilities as the claimed compounds, or to induce, as a precursor, the same or similar activities and utilities as the claimed compounds.

As used herein, the term "derivative" refers to a compound having a structure derived from the structure of a parent compound (e.g., a compound disclosed herein) and whose structure is sufficiently similar to those disclosed herein and based upon that similarity, would be expected by one skilled in the art to exhibit the same or similar activities and utilities as the claimed compounds, or to induce, as a precursor, the same or similar activities and utilities as the claimed compounds. Exemplary derivatives include salts, esters, amides, salts of esters or amides, and N-oxides of a parent compound.

A residue of a chemical species, as used in the specification and concluding claims, refers to the moiety that is the resulting product of the chemical species in a particular reaction scheme or subsequent formulation or chemical product, regardless of whether the moiety is actually obtained from the chemical species. Thus, an ethylene glycol residue in polyester refers to one or more —$OCH_2CH_2O$— units in the polter, regardless of whether ethylene glycol was used to prepare the polter. Similarly, a sebacic acid residue in polyester refers to one or more —$CO(CH_2)_8CO$— moieties in the polter, regardless of whether the residue is obtained by reacting sebacic acid or an ester thereof to obtain the polyester.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$," "$A^2$," "$A^3$," and "$A^4$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms. Non-limiting examples of alkyls include C1-18 alkyl, C1-C12 alkyl, C1-C8 alkyl, C1-C6 alkyl, C1-C3 alkyl, and C1 alkyl.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

The term "alkenyl" as used herein is a hydrocarbon group of 2 to 24 carbon atoms with a structural formula containing at least one carbon-carbon double bond. The alkenyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein. Non-limiting examples of alkenyls include C2-18 alkenyl, C2-12 alkenyl, C2-8 alkenyl, C2-6 alkenyl, and C2-3 alkenyl.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein. Non-limiting examples of alkynyls include C2-18 alkynyl, C2-12 alkynyl, C2-8 alkynyl, C2-6 alkynyl, and C2-3 alkynyl.

The terms "amine" or "amino" as used herein are represented by the formula—$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

Certain materials, compounds, compositions, and components disclosed herein can be obtained commercially or readily synthesized using techniques generally known to those of skill in the art. For example, the starting materials and reagents used in preparing the disclosed compounds and compositions are either available from commercial suppliers such as Aldrich Chemical Co., (Milwaukee, Wis.), Acros Organics (Morris Plains, N.J.), Fisher Scientific (Pittsburgh, Pa.), or Sigma (St. Louis, Mo.) or are prepared by methods known to those skilled in the art following procedures set forth in references such as Fieser and Fieser's Reagents for Organic Synthesis, Volumes 1-17 (John Wiley and Sons, 1991); Rodd's Chemistry of Carbon Compounds, Volumes 1-5 and Supplemental (Elsevier Science Publishers, 1989); Organic Reactions, Volumes 1-40 (John Wiley and Sons, 1991); March's Advanced Organic Chemistry, (John Wiley and Sons, 4th Edition); and Larock's Comprehensive Organic Transformations (VCH Publishers Inc., 1989).

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

B. Ferroelectric Agglomerates

Disclosed herein are ferroelectric agglomerates. A ferroelectric agglomerate possesses ferroelectric properties.

The agglomerates are generally made from a chemical treatment of particles, such as nanoparticles, i.e. quantum dots in a solution. The particles are stabilized with surface ligands. The surface ligands can be of moderate binding strength, such as the binding strength of oleic acid to a particle comprising CdSe. The particles are treated with a composition comprising $SbX_3$ and/or $SbX_5$, wherein X is a halogen. In one aspect the ferroelectric agglomerates comprises semi-crystalline matrix. The ferroelectric agglomerates have extreme susceptibility to electric fields and reversible dipole moments.

The size of the agglomerates can be altered and has a dependence on multiple factors including the relative concentration of the particles to the $SbX_3$ and/or $SbX_5$. Furthermore, the size of the agglomerates can be altered by using different halogens, for example, Cl or I, and whether $SbX_3$ or $SbX_5$ is used in the production of the ferroelectric agglomerates. The solvent in which the agglomerates are made also influences the size of the ferroelectric agglomerates.

The agglomerates susceptibility within an applied field is size-dependent with smaller ferroelectric agglomerates demonstrating higher susceptibility.

Heat-treating the ferroelectric agglomerate solutions to moderate temperatures (depending on the solvent), a reduction in the size of agglomerates and an increase in solution stability is achieved.

Figure 1B:
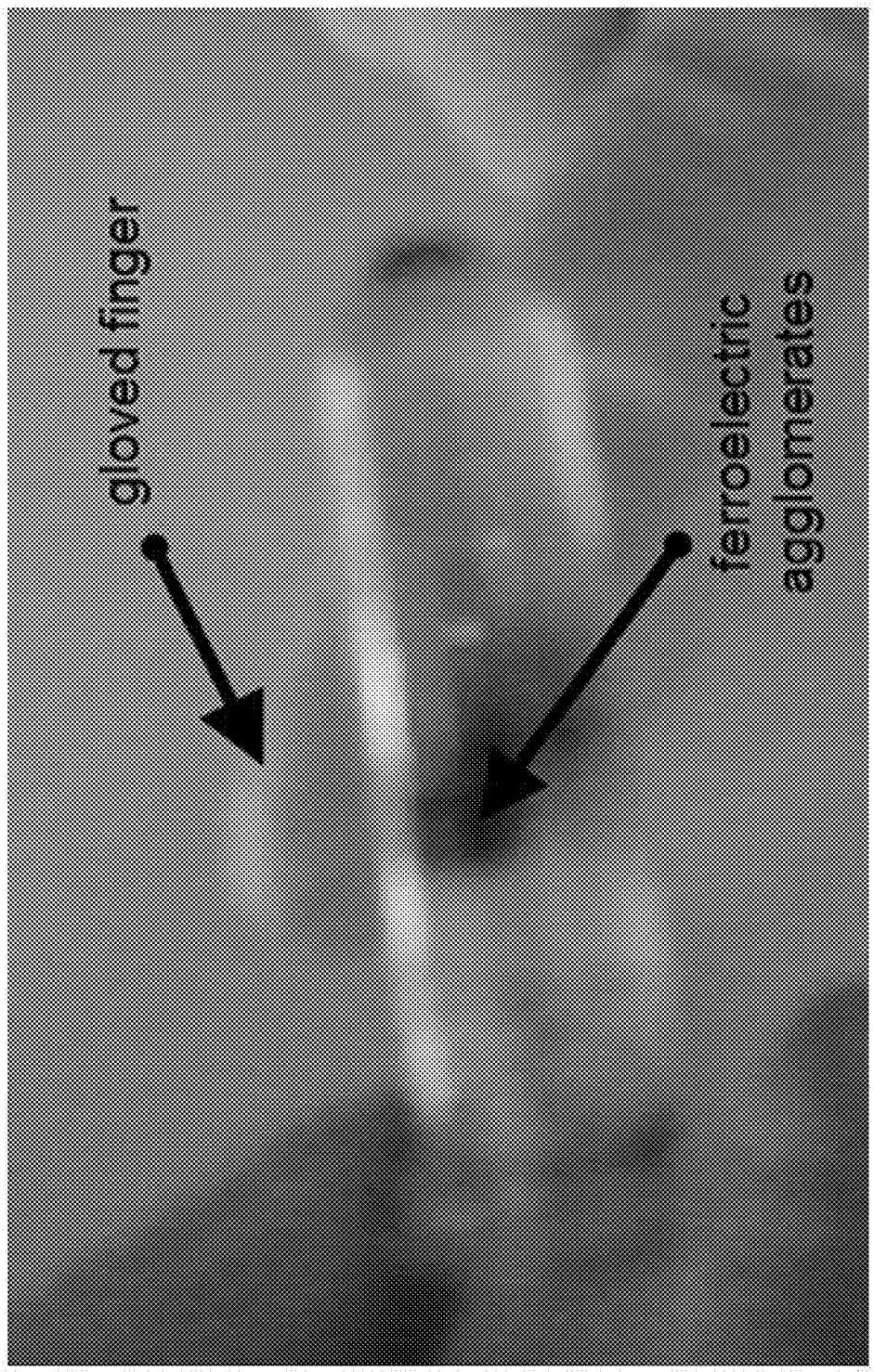

The susceptibility of the ferroelectric agglomerates to very low static electric fields readily allows the manipulation and movement of the ferroelectric agglomerates in a fluid by application of a minimal electric field. For example, the agglomerates are susceptible to the electric field generated by a gloved finger moving along a test tube comprising the ferroelectric agglomerates and a solvent (see FIG. 1). This ease of movement allows infiltration and manipulation of a non-ferroelectric nanofluid only previously achieved through direct pressure or large magnetic and/or electric fields.

Disclosed herein is a ferroelectric agglomerate comprising a particle, a matrix, and a surface ligand, wherein the particle comprises antimony and at least a first portion of a particle body, wherein the matrix comprises at least a second portion of particle body and halogen.

In one aspect, the particle is at least partially embedded within the matrix. For example, the particle can be surrounded by matrix.

In one aspect, the first portion of the particle body can be an anion of the particle body.

In one aspect, the second portion of the particle body can be a cation of the particle body.

In one aspect, the first portion of the particle body and the second portion of the particle body can be the same type of atom, such as, Au or Ag.

In one aspect, the ferroelectric agglomerate comprises one particle. In another aspect, the ferroelectric agglomerate comprises one or more particles. In yet another aspect, the ferroelectric agglomerate comprises two or more particles, such as discrete particles.

Also disclosed herein is a ferroelectric agglomerate made from a method disclosed herein.

Also disclosed herein is a ferroelectric agglomerate comprising $Sb_2Se_3$ and $CdCl_2$. In one aspect, the ferroelectric agglomerate further comprises a particle, wherein particle comprises a particle body and a surface ligand.

Also disclosed herein is a ferroelectric agglomerate comprising atoms of a particle body, Sb, and X, wherein X is a halogen. In one aspect, the ferroelectric agglomerate further comprises a particle, wherein particle comprises a particle body and a surface ligand. The term "atoms of a particle body" as used herein refers to atoms that at least in one point in time were present in a particle body. In one aspect, such atoms in a ferroelectric agglomerate are not a part of a particle body within the ferroelectric agglomerate. In another aspect, such atoms in a ferroelectric agglomerate are a part of a particle body within the ferroelectric agglomerate. In yet another aspect, a portion of the atoms is not a part of a particle body within the ferroelectric agglomerate, and another part of the atoms are a part of a particle body within the ferroelectric agglomerate.

In one aspect, the atoms of a particle body is selected from Cd, Se, Pb, S, Fe, O, Au, Ag, Te, In, Sn, Eu, Si, Ti, and Ba, or a combination thereof. For example, the atoms of a particle body are Cd and Se.

The particle in the ferroelectric agglomerate is not limited to shape or size. In one aspect, the particle is a microparticle or nanoparticle. For example, the particle can be a microparticle. In another aspect, the particle can be a nanoparticle, such as a quantum dot. In another aspect, the particle can be a rod or sphere, for example, a sphere. In another aspect, the particle can be a tube, such as a nanotube. In yet another aspect, the particle can be a star, cube, tetrapod, multipod, reef, box, or pyramid.

In one aspect, the ferroelectric agglomerate has a diameter smaller than 50 µm, 25 µm, 10 µm, 8 µm, 6 µm, 4 µm, 2 µm, 1 µm, 800 nm, 600 nm, 400 nm, 200 nm, 100 nm, 75 nm, 50 nm, 25 nm, 20 nm, 15 nm, 10 nm, 8 nm, 6 nm, or 4 nm.

In another aspect, the ferroelectric agglomerate has a diameter from 2 nm to 50 µm, such as, for example, 2 nm to 10 µm, 2 nm to 1 µm, 2 nm to 200 nm, 2 nm to 50 nm, or 2 nm to 20 nm. In another example, the ferroelectric agglomerate has a diameter from 1 µm to 50 µm, such as, for example, 1 µm to 25 µm, 1 µm to 10 µm, 1 µm to 8 µm, or 1 µm to 6 µm.

In one aspect, the particle can have a diameter smaller than 10 µm, 8 µm, 6 µm, 4 µm, 2 µm, 1 µm, 800 nm, 600 nm, 400 nm, 200 nm, 100 nm, 75 nm, 50 nm, 25 nm, 20 nm, 15 nm, 10 nm, 8 nm, 6 nm, 4 nm, or 2 nm.

In another aspect, the particle can have a diameter from 1 nm to 10 µm, such as, for example, 1 nm to 5 µm, 1 nm to 1 µm, 1 nm to 200 nm, 1 nm to 50 nm, 1 nm to 30 nm, 1 nm to 20 nm, 1 nm to 10 nm, 1 nm to 5 nm, or 1 nm to 3 nm. In another example, the particle has a diameter from 1 µm to 10 µm, such as, for example, 1 µm to 5 µm, 1 µm to 3 µm, or 1 µm to 2 µm.

In one aspect, X is Cl, I, Br, or F. For example, X can be Cl or I. In another example, X can be Cl. In yet another example, X can be I.

In one aspect, the ferroelectric agglomerate has a high susceptibility to electric fields and reversible dipole moments. For example, the ferroelectric agglomerate can be susceptible to the electric field generated by a gloved finger moving along a test tube comprising the ferroelectric agglomerates and a solvent (see FIG. 1). The smaller the size of the ferroelectric agglomerates the higher the rate of ferroelectric agglomerate movement within a solvent.

In one aspect, the ferroelectric agglomerate is semi-crystalline or crystalline. For example, the ferroelectric agglomerate can be semi-crystalline. The ferroelectric agglomerate can be semi-crystalline due to a semi-crystalline matrix formed during the production of the ferroelectric agglomerate.

In one aspect, the ferroelectric agglomerate have ferroelectric properties for at least 1 week, 2 weeks, 1 month, 3 months, 6 months, 1 year, 5 years, or 10 years. For example, the ferroelectric agglomerate can have ferroelectric properties for at least 1 month or 6 months. In another example, the ferroelectric agglomerate can have ferroelectric properties for at least 1 year.

In one aspect, the particle is not ferroelectric before being present in the ferroelectric agglomerate. When the particle is present in the ferroelectric agglomerate the particle is considered to be ferroelectric because it is present in the ferroelectric agglomerate.

In one aspect, the particle is fluorescent, cytotoxic, radioactive, antimicrobial, antibacterial, hydrophilic, hydrophobic, or a quantum dot. For example, the particle can be fluorescent or a quantum dot. A ferroelectric agglomerate comprising a fluorescent particle or quantum dot can be used for imaging and diagnosis. In another example, the particle is cytotoxic or radioactive. A ferroelectric agglomerate comprising a cytotoxic or radioactive can be used to treat disease. For example, an electric field can be used to move the ferroelectric agglomerate to an area of interest (i.e. a tumor) and the cytotoxic or radioactive particle can treat a condition, such as cancer. In another example, the particle can be antimicrobial and/or antibacterial. A ferroelectric agglomerate comprising a antimicrobial and/or antibacterial particle can be used to treat microbial or bacterial infections. In one aspect, the use of the ferroelectric agglomerates can be done on a biopsied specimen.

In one aspect, the particle body can comprise one or more types of atoms. For example, the particle body can comprise a binary compound, for example CdSe. In another example, the particle body can comprise one type of atoms, for example, Au.

The particle body can comprise any type of atom or combination of atoms capable of forming a particle. For example, the particle body can comprise CdSe, PbS, $Fe_3O_2$, Au, CdTe—CdS, Ag, ZnO, Au, $AgInS_2$—ZnS, ZnCuInS—ZnS, SnS, EuS, or CdSe—ZnS, or a combination thereof. For example, the particle body can comprise CdSe. In another example, the particle body can comprise PbS. In yet another example, the particle body can comprise $Fe_3O_2$. In yet another example, the particle body can comprise Au. In yet another example, the particle body can comprise CdTe—CdS. In yet another example, the particle body can comprise Ag. In yet another example, the particle body can comprise AgInS$_2$—ZnS. In yet another example, the particle body can comprise ZnCuInS—ZnS. In yet another example, the particle body can comprise SnS. In yet another example, the particle body can comprise EuS. In yet another example, the particle body can comprise CdSe—ZnS. In yet another example, the particle body can comprise CuInS$_2$.

In one another example, the particle body can comprise SiO$_2$, TiO$_2$, BaTiO$_3$, CdTe, VO2, PbSe, Cu, or CuS, or a combination thereof.

A surface ligand is a compound, which interacts with the particle body. The interaction between the surface ligand and the particle body can be via, for example, a covalent bond, ionic bond, van der Waals interaction, and/or hydrogen bond.

In one aspect, the surface ligand interacts with the particle body at a medium or low strength, such as the strength between a particle body comprising CdSe and an oleic acid surface ligand.

In one aspect, the surface ligand is selected from $(R^1)_m$-alkyl, $(R^1)_m$-alkenyl, $(R^1)_m$-alkynyl, and $(R^1)_m$-peptide, and is substituted with 0, 1, 2, or 3 groups selected from aryl, cycloalkyl, cycloalkenyl, heterocyclyl, heteroaryl, -alkyl-aryl, -alkenyl-aryl, alkynyl-aryl, -alkyl-cycloalkyl, -alkenyl-cycloalkyl, alkynyl-cycloalkyl, alkyl-heterocyclyl, -alkenyl-heterocyclyl, alkynyl-heterocyclyl, -alkyl-heteroaryl, -alkenyl-heteroaryl, alkynyl-heteroaryl, alkyl, alkenyl, alkynyl, haloalkyl, haloalkenyl, haloalkynyl, alkoxy, aryloxy, mono- or di-alkylamino, a mono- or diaryl amino, hydroxyl, thiol, nitro, cyano, amino, halo, —C(O)O—R$^2$, —C(O)—R$^2$, —COR$^2$, and —OR$^2$; wherein each R$^1$ is independently selected from —COOH, —NH$_2$, —SH, —Si(R$^3$)$_3$, and —PO(OR$^4$)$_2$; wherein each R$^2$ is independently selected from hydrogen, alkyl, haloalkyl, polyhaloalkyl, alkylamino, dialkylamino, -alkyl-aryl, and -alkyl-heterocyclyl; wherein each R$^3$ is independently selected from hydrogen, halogen, and alkyl; wherein each R$^4$ is independently selected from hydrogen, alkyl, and aryl; and wherein m is 1, 2, 3, 4, or 5.

In one aspect, the surface ligand is selected from $(R^1)_m$-alkyl, $(R^1)_m$-alkenyl, and $(R^1)_m$-peptide. For example, the surface ligand can be $(R^1)_m$-alkyl. In another example, the surface ligand can be $(R^1)_m$-alkenyl. In yet another example, the surface ligand can be $(R^1)_m$-peptide. In yet another example, the surface ligand can be $(R^1)_m$-alkynyl.

In one aspect, the surface ligand is selected from $(R^1)_m$—C1-C18 alkyl, and $(R^1)_m$—C2-C18 alkenyl.

In one aspect, R$^1$ is —COOH. In another aspect, R$^1$ is —NH$_2$. In yet another aspect, R$^1$ is —SH. In yet another aspect R$^1$ is —Si(R$^3$)$_3$. In yet another aspect R$^1$ is PO(OR$^4$)$_2$.

In one aspect R$^2$ is hydrogen or alkyl. For example, R$^2$ can be hydrogen.

In one aspect, each R$^3$ is hydrogen. In another aspect, at least one R$^3$ is hydrogen. In yet another aspect, at least one R$^3$ is halogen, such as Cl.

In one aspect, each R$^4$ is independently hydrogen or alkyl. In another aspect, each R$^4$ is hydrogen.

In one aspect, m is 1. In another aspect, m is 2. In yet another aspect, m is 3. In yet another aspect, m is 4. In yet another aspect, m is 5.

In one aspect, the surface ligand is selected from oleic acid, oleylamine, citrate, cysteamine, glutathione, and mercaptoundecanoic acid. For example, the surface ligand can be oleic acid. In yet another example, the surface ligand can be oleylamine. In yet another example, the surface ligand can be citrate. In yet another example, the surface ligand can be cysteamine. In yet another example, the surface ligand can be glutathione. In yet another example, the surface ligand can be mercaptoundecanoic acid.

Also disclosed herein is a fluid comprising a ferroelectric agglomerate and a solvent.

In one aspect, the solvent is a non-polar solvent, such as, alkanes, such as hexanes, benzene, toluene, chloroform, diethyl ether, and dioxanes. For example, the non-polar solvent can be hexanes, toluene, benzene, or chloroform. In another aspect the solvent comprises a non-polar solvent and a polar solvent, such as, for example, ethyl acetate, tetrahydrofuran (THF), dichloromethane, acetone, acetonitrile, dimethylformamide, dimethylsulfoxide, acetic acid, and alcohols, such as, for example, butanol, isopropanol, ethanol, and methanol.

In another aspect, the solvent is a polar solvent, such as, for example, ethyl acetate, tetrahydrofuran (THF), decholormethane, acetone, acetonitrile, demethylformamide, dimethyl sulfoxide, acetic acid, and alcohols, such as, for example, butanol, isopropanol, ethanol, and methanol.

In one aspect, the temperature of the solvent is from 40° C. to 90° C. The temperature of the solvent is dependent on the boiling point of the solvent, the temperature of the solvent should be lower than the boiling point of the solvent. Thus, in one example, the temperature of the solvent is from 40° C. to 70° C. or from 40° C. to 60° C.

In one aspect, the ferroelectric particles are also ferromagnetic.

C. Methods of Producing

The ferroelectric agglomerates disclosed herein can be made by the methods disclosed herein.

Disclosed herein is a method of producing a ferroelectric agglomerate comprising a) providing a particle comprising a particle body and a surface ligand; and b) treating the particle with a composition comprising SbX$_3$ or SbX$_5$, wherein X is a halogen.

It is known in the art how to make the particles comprising particle body and a surface ligand disclosed herein. For example, particles like Au-oleylamine and Ag-oleylamine can be produced by the methods disclosed in Hiramatsu, et al. *Chem. Mater.*, 2004, 16 (13), pp 2509-2511, which is hereby incorporated in its entirety by reference. In another example, particles like AgInS$_2$/ZnS— oleylamine can be produced by the methods disclosed in Torimoto, et al., *Chem. Commun.*, 2010, 46, 2082-2084, which is hereby incorporated in its entirety by reference. In another example, particles like CdS— oleylamine/hexadecylamine and ZnS-oleylamine/hexadecylamine can be produced by the methods disclosed in Zhong, et al., *J. Mater. Chem.* 2004, 14, pp 2790-2794, which is hereby incorporated in its entirety by reference. In another example, particles like ZnO-oleic acid can be produced by the methods disclosed in O'Brien, et al., *J. Phys. Chem. B*, 2005, 109 (30), pp 14314-14318, which is hereby incorporated in its entirety by reference. In another example, particles like CdS-oleic acid can be produced by the methods disclosed in Joo, et al., *J. Am. Chem. Soc.*, 2003, 125 (36), pp 11100-11105, which is hereby incorporated in its entirety by reference. In another example, particles like SnS-oleic acid/oleylamine and EuS-dodecanethiol can be produced by the methods disclosed in Liu, et al., *Nanotechnology*, 2010, 21, 105707 and, Koktysh et al. *Nanotechnology*, 2010, 21, 415601, which are both hereby incorporated in its entirety by reference. In another example, particles like SnS-dodecanethiol can be produced by the methods disclosed in Koktysh, et al., *Mat. Science and Engineering*, 2010, 170, pp 117-122, which is hereby incorporated in its entirety by reference. In another example, particles like Au-cysteamine/glutathione can be produced by the methods disclosed in Yu, et al., *J. Am. Chem. Soc.* 2011, 133, pp 11014-11017, which is hereby incorporated in its entirety by reference. In another example, particles like ZnCuInS$_2$/ZnS-dodecanethiol and ZnCuInS$_2$/ZnS-mercaptoundecanoic acid can be produced by the methods disclosed in Chen, et al., *Appl. Phys. Lett.* 2012, 101, pp 041908, which is hereby incorporated in its entirety by reference. In another example, particles like AgInS$_2$/ZnS— glutathione and CdTe/CdS— glutathione can be produced by the methods disclosed in Koktysh, et al., *Nanotechnology,* 2011. *V.*22. 275606, which is hereby incorporated in its entirety by reference. In another example, particles like Ag-citrate and Au-citrate can be produced by the methods disclosed in Vongsavat, et al., *ACS Appl. Mater. Interfaces,* 2011, 3 (9), pp 3616-3624 and Xue, et al., *Angewandte Chemie* 2007, 119)44) pp 8588-8591 respectively, which are both hereby incorporated in its entirety by reference. In another example, particles like CdTe/CdS-mercaptoundecanoic acid can be produced by the methods disclosed in Ying, et al., *PLoS ONE* 3(5): e2222, 2008, which is hereby incorporated in its entirety by reference. In another example, particles like CdSe-surface ligand can be produced by the methods disclosed in Garnett, et al., *Journal of Physical Chemistry C*, vol. 112, pp. 12736-12746, 2008; Rosenthal et al. *Surf. Sci. Rep.,* vol. 62, no. 4, pp. 111-157, 2007; Bullen et al., *Nano Letters*. vol. 4, no. 12, pp. 2303-2307, 2004 and which are all hereby incorporated in their entirety by reference. In another example, particles like PbS-surface ligand can be produced by the methods disclosed in Hines, et al., *Adv. Mater.* (2003), 15 (21), 1844, which is hereby incorporated in its entirety by reference.

In one aspect, the composition comprises SbX$_3$. In another aspect, the composition comprises SbX$_5$. In yet another aspect, the composition comprises SbX$_3$ and SbX$_5$.

In one aspect, the treating is in the presence of a sufficient amount of H$_2$O to cause a reaction with the SbX$_3$ or SbX$_5$.

In one aspect, the amount of H$_2$O is sufficient to cause a reaction with SbX$_3$ and/or SbX$_5$ to produce a ferroelectric agglomerate. Thus, in one aspect, the amount of H$_2$O is not sufficient to produce non-ferroelectric agglomerates or other non-ferroelectric products.

In one aspect, X is Cl, I, Br, or F. For example, X can be Cl or I. In another example, X can be Cl. In yet another example, X can be I.

In one aspect, the composition comprising SbX$_3$ or SbX$_5$ further comprises a first solvent.

In one aspect, the molar ratio of atoms or molecules in the particle body and the SbX$_3$ or SbX$_5$ is from 0.5:1 to 2:1. For example, the molar ratio of the particle body and the SbX$_3$ or SbX$_5$ is about 1:1.

In one aspect, providing a particle comprising a particle body and a surface ligand comprises providing the particle in a second solvent.

In one aspect, the first solvent and the second solvent are miscible. For example, both the first solvent and the second solvent can be non-polar solvent. In another example, both the first solvent and the second solvent can be polar solvent.

In another aspect, first solvent and the second solvent can be the same solvent.

Suitable non-polar solvents include, but are not limited to, alkanes, such as hexanes, benzene, toluene, chloroform, diethyl ether, and dioxanes. For example, a non-polar solvent can be hexanes, toluene, benzene, or chloroform. In another aspect the solvent comprises a non-polar solvent and a polar solvent, such as, for example, ethyl acetate, tetrahydrofuran (THF), dichloromethane, acetone, acetonitrile, dimethylformamide, dimethylsulfoxide, acetic acid, and alcohols, such as, for example, butanol, isopropanol, ethanol, and methanol.

Suitable polar solvents include, but are not limited to, ethyl acetate, tetrahydrofuran (THF), decholormethane, acetone, acetonitrile, demethylformamide, dimethyl sulfoxide, acetic acid, and alcohols, such as, for example, butanol, isopropanol, ethanol, and methanol.

In one aspect, the treating comprises mixing the composition comprising SbX$_3$ or SbX$_5$ and the first solvent with the second solvent comprising the particle. The mixing can be achieved by means known to those skilled in the art. Suitable mixing techniques include, but are not limited to, stirring, sonication, and shaking. The ferroelectric agglomerates are generally formed within a short period of time, for example, within 10 minutes, upon mixing. In one example, mixing is done by shaking.

In one aspect, the method further comprises heating first and/or second solvent to a temperature from 40° C. to 90° C. after the ferroelectric agglomerate has been formed. The first and/or second solvent can also be heated before the ferroelectric agglomerate is formed. Once heated, the ferroelectric agglomerate can become semi-crystalline or crystalline. For example, the ferroelectric agglomerate can become semi-crystalline.

The heating of the first and/or second solvent is dependent on the boiling point of the solvent, the temperature of the solvent should be lower than the boiling point of the solvent. Thus, in one example, the temperature of the first and/or second solvent can be from 40° C. to 70° C. or from 40° C. to 60° C.

The heating of the first and/or second solvent makes the ferroelectric agglomerates more stable in the solution than compared to a solution where the first and second solvent is not heated.

Also disclosed herein are ferroelectric agglomerates produced from the methods described herein.

D. Methods of Using

Also disclosed herein is a method of using the ferroelectric agglomerate disclosed herein.

The disclosed ferroelectric agglomerates can be used in methods utilizing capacitors, piezoelectrics for ultrasound imaging and actuators, electro-optic materials for data storage, transistors, switches, oscillators, filters, light deflectors, light modulators, and light displays.

In one aspect, the method comprises providing a ferroelectric agglomerate comprising a detectable particle, and detecting the particle.

The detectable particle can be a particle described elsewhere herein. For example, the detectable particle can be a fluorescent or radioactive particle. Detecting can be done by a variety of techniques known to those skilled in the art. For example, fluorescent detectors can be used to detect a fluorescent particle. In another example, a radioactive particle can be detected by a detector that detects radiation.

The ferroelectric agglomerates can be used for mechanical endurance applications. The ferroelectric agglomerates can be used to prevent friction wear between surfaces. Normally fluids comprising particles are introduced to a machine. The introduction of the ferroelectric agglomerates disclosed herein can be done during machine fabrication or under the application of a large electric field due to the intimate contact between machine parts. The disclosed ferroelectric agglomerates can be introduced post-fabrication by utilizing only a low electrostatic field, and upon degradation can be readily removed and replaced in the same fashion. Such ease of introduction and cannot be achieved with other fluids.

The ferroelectric agglomerates can also be used in ferroelectric tunneling junctions, such as in thin film ferroelectrics. In order to create stable thin films of only a few nanometers, the size required to allow electron tunneling to be observed, the thin film must be deposited directly upon the electrodes of interest. The disclosed ferroelectric agglomerates can be used to create a nanometer size junction with the benefit that it can readily be removed without destruction of the electrode surface.

The ferroelectric agglomerates can also be used in smart glass. Electrochromic materials can change their absorption when electricity is applied to the material; however, the transition is traditionally slow. The disclosed ferroelectric agglomerates rapidly responds to a low electrostatic field so that when sandwiched within a window under an applied field the window could quickly transition from high absorbance to transparent and vice versa.

E. Articles

Also disclosed herein is an article comprising a ferroelectric agglomerate disclosed herein.

The article can be any article that can comprise a ferroelectric material. For example, it can be an article that comprises a piezoelectric material.

In one aspect, the article is selected from smart glass, e-ink, ink, electroscope, monitor, toner, and electrospray paint.

In another aspect, the article is selected from capacitors, for example, thin-film capacitors, piezoelectrics for ultrasound imaging and actuators, electro-optic materials for data storage, transistors, switches, transducers, sensors, for example, a pyroelectric sensor, modulators, for example, an electrooptic modulator, optical memory articles, oscillators, filters, light deflectors, light modulators, and light displays.

As described, the ferroelectric agglomerates can be useful in variety of articles and methods such as imaging by treating fluorescent particles and using low-strength electrostatic fields to migrate the agglomerates to area of interest. Mechanical endurance by using a low field to position in between moving parts in a machine or device. The ferroelectric agglomerates are useful in any use of ferroelectric materials including, but not limited to, radiation detector (electroscope), spark discharge monitor, e-ink, ink for dip pen lithography, printer toner, electrospray paint, and (of particular interest to the inventor) a ferroelectric tunneling junction, or smart glass.

The ferroelectric agglomerates can be used for diagnostic or imaging applications by using fluorescent, radioactive, or otherwise detectable particles in the agglomerate. The ferroelectric agglomerates can then be moved into an area of interest, for example a location of a body in a human or animal, by using low electrostatic field rather than relying on systemic uptake and delivery, allowing more reliable and efficient introduction of materials in areas desired and limiting excess distribution to undesired areas. Accordingly, the ferroelectric agglomerates can be present in an article suitable for these applications.

F. Examples

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Several methods for preparing the compounds of this invention are illustrated in the following Examples. Starting materials and the requisite intermediates are in some cases commercially available, or can be prepared according to literature procedures or as illustrated herein.

1. Experimental Methods a. Synthesis of CdSe Quantum Dots

CdSe quantum dots (QDs) were synthesized as follows: 0.25 g CdO, 1.5 mL oleic acid, and 18.5 mL octadecene were stirred and heated to 280° C. in a sealed 3-neck flask under argon flow. A temperature probe and heating mantle were used to monitor and maintain appropriate heating conditions. To remove excess water, the reaction vessel was purged using a 12-gauge needle inserted into a rubber septum until the reaction temperature reached 150° C. Once the reaction reached 280° C., the reaction solution was clear, indicating that the brown CdO had converted to colorless Cd-oleate. The reaction was cooled to 150° C. and a solution of 0.5 g trioctylphenylphosphine oxide, 1.5 g octadecylamine, and 8.0 mL octadecene heated to 80° C. was injected to aid in shape-control during quantum dot growth. The solution was heated to 280° C. and 1.0 mL 1.5M Se: tributylphosphine (2.37 g Se powder dissolved in 20 mL tributylphosphine) was injected. The reaction solution quickly changed to a dark, reddish brown color, indicating quantum dot production. The reaction vessel was cooled to below 90° C. using compressed air. The resulting product was dispersed in toluene. To remove excess ligands remaining reactants, the product was washing using a series of precipitations and centrifugation. A small amount of the toluene-dispersed product was diluted with a large amount of ethanol and spun at 6500 rpm for 15 min. The supernatant was discarded and the clean pellet was retained for further experiments. From the pellet, 0.01 g portions for TGA, ATR, and polarization response were taken and dried under 30 mTorr vacuum for 12 h. The rest of the quantum dots were diluted with toluene to a concentration of 2.5 mM.

Alternatively, 0.5 g CdO, 5 mL oleic acid, and 16 mL octadecene were stirred and heated to 250° C. in a sealed 3-neck flask under argon flow. A temperature probe and heating mantle were used to monitor and maintain appropriate heating conditions. To remove excess water, the reaction vessel was purged using a 12-gauge inserted into a rubber septum until the reaction temperature reached 150° C. Once the reaction reached 250° C., the reaction solution was clear, indicating that the brown CdO has converted to colorless Cd-oleate. The reaction was cooled to 180° C., and a solution of 1 g trioctylphenylphosphine oxide, 3 g octadecylamine, and 4 mL octadecene heated to 80° C. was injected to aid in shape-control during quantum dot growth. The reaction solution was heated to 280° C., and 2 mL 1.5 M Se: tributylphosphate (2.37 g Se powder dissolved in 20 mL tributylphosphate). The reaction solution quickly changed to a dark, reddish brown color, indicating quantum dot production. The reaction vessel was cooled to below 90° C. using compressed air. The resulting product was dispersed in butanol. To remove excess ligands and remaining reactants, the product was washed using a series of precipitations using centrifugation. A small amount of the butanol-dispersed product was diluted with a large amount of ethanol and spun at 6500 rpm for 15 min. The resulting pellet contained the desired quantum dots and was retained; the supernatant contained excess ligands and unreacted starting materials and was poured off the pellet and discarded. The cleaning process was repeated for a total of three cycles.

After the final cycle, the quantum dots were diluted with toluene to a concentration of $2.5 \times 10^{-3}$ M.

b. Preparation of $SbCl_3$ Solution

Equal volumes of equimolar solutions of CdSe quantum dots capped with oleic acid surface ligands in toluene and antimony trichloride in toluene were mixed via shaking Upon shaking, visible agglomerates form within the solution and settle to the bottom of the reaction vessel. Specifically, a 2.5 mM solution of $SbCl_3$ was prepared by combining 60 mg $SbCl_3$ and 100 mL of toluene, followed by shaking until the solid was dissolved.

c. Treatment of CdSe Quantum Dots with $SbCl_3$ 0.75 mL of 2.5 mM CdSe quantum dots in toluene was combined and shaken with 0.75 mL of 2.5 mM $SbCl_3$ in toluene. Upon mixing, the suspended quantum dots fell out of solution as agglomerates that display ferroelectric properties. To investigate the reaction progress, samples of QDs were treated for one minute to investigate the completed reaction. To ensure unreacted materials were removed from the products, the samples were cleaned by centrifuging at 8000 rpm for one minute, resuspended in toluene, and centrifuged again. The supernatant contained any unreacted material, so it was discarded; the pellet was retained. For ATR, TGA, and polarization response, the clean pellet was separated into 0.01 g portions and dried under 30 mTorr vacuum for 12 h. To observe translocation of the product in a non-polar solvent, the pellet was shaken with toluene until the particles were suspended; a gloved finger or hand-held Van de Graaf generator were brought into proximity of the particle container. The movement of the particles in response to the electric fields was photographed and filmed.

Figure 2A:
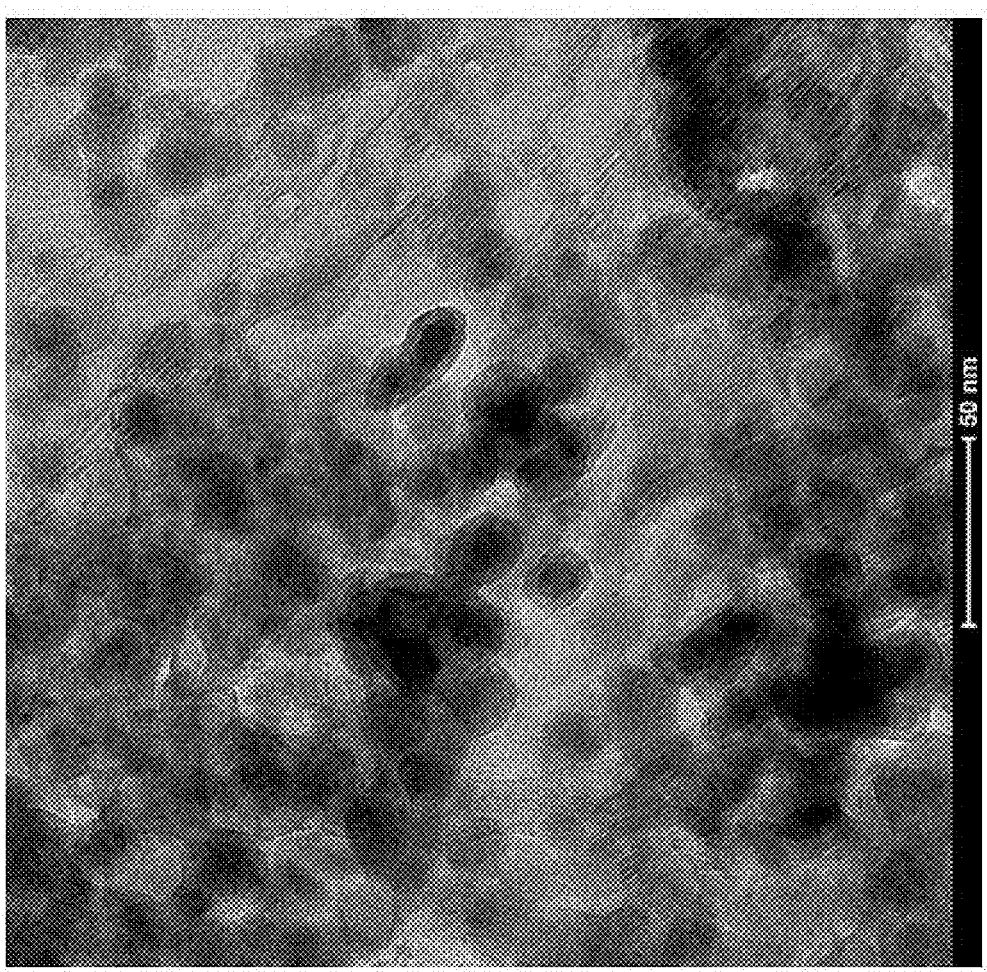
FIG. 2A and FIG. 2B show transmission electron micrographs (TEM) of ferroelectric agglomerates made from CdSe treated with $SbCl_3$.
Figure 2B:
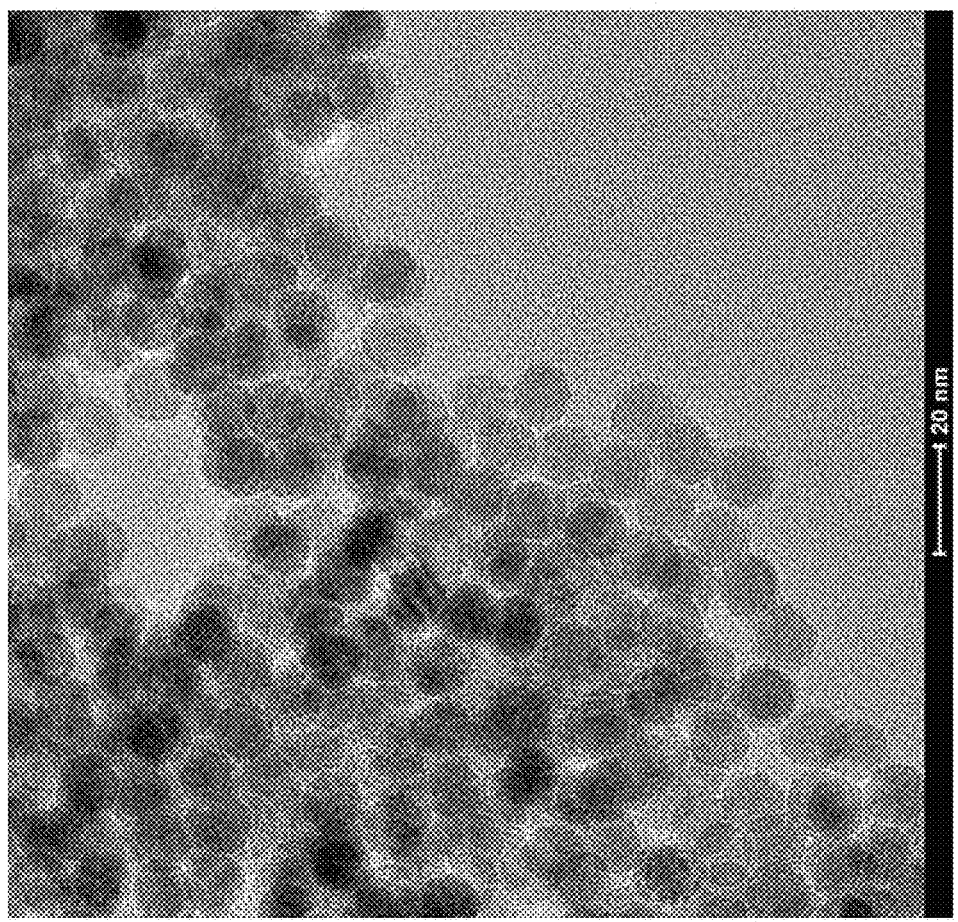

The ferroelectric agglomerates made as described above can have core-shell type structures within larger crystalline matrix as shown in FIG. 2.

d. Polarization Response

To prepare the sandwich cell, two ITO glass slides were cleaned by sonication in 0.3% soap solution, then action, then isopropanol followed by drying with nitrogen. A 20 µM spacer with 0.19 cm² active area was prepared by using a hole punch to remove a circle from a 2 inch square of Vibac™ Sealast tape. To remove the adhesive, the tape was soaked for 15 min in hexanes, leaving only a 20 µM thick sheath. The sheath was wrapped around an ITO slide and held taut as the 0.01 g portion of dried sample was placed in the active area. The sample was compressed and spread over the active region by placing the second ITO slide over the area and compressing. To ensure connectivity, a drop of isotropic n-heptane was added to the sample and the cell was secured with binder clips.

The cell was connected in series with a 4.7 µF reference in the traditional Sawyer-Tower circuit. A ±10V triangular waveform was applied to the circuit at a frequency of 0.5 V/s using a Keithley power source. Channel 1 on the oscilloscope monitors the voltage input by connecting across the electrodes of the Keithley; the electric field across the sample is taken as the quotient of the voltage input and the thickness of the sample. Channel 2 of the oscilloscope measures the voltage across the reference capacitor by connecting across the terminals of the capacitor. The charge across the reference capacitor was calculated as the product of the reference capacitance and the voltage across the reference capacitor. Because the reference capacitor is in series with the sample, this charge is equivalent to the charge across the sample. The polarization of the sample was calculated as the quotient of the charge and the active area of the electrodes.

e. ATR

ATR was performed on a ThermoScientific Nicolet iS5 FT-IR spectrometer with iD5 diamond crystal ATR accessory on 0.01 g dried samples in the range of 600-4000 cm$^{-1}$. A background scan was taken between each sample. For controls, oleic acid and $CdCl_2$ were scanned as purchased. Cd-oleate was prepared following the synthetic procedure for CdSe QDs above, excluding the octadecene and stopping before the addition of the secondary ligands. The as-synthesized Cd-oleate was cleaned and dried in the same fashion as the QDs prior to performing ATR.

f. TGA

TGA was performed on an Instrument Specialists' TGA-1000 with a platinum pan containing the dried sample and heated under a nitrogen flow of 90 sccm from 80-600° C. with a heating rate of 20° C./min and sampling rate of 1 Hz.

g. Stem-EDS

Cleaned samples in toluene were shaken to suspend the particles and a drop of the solution was placed on an ultrathin carbon TEM support film (Ted Pella 1822-F) held by anticapillary tweezers. Excess solvent was wicked away using a Kimwipe®. The as-prepared samples were imaged and analyzed on a FEI Tecani Osiris STEM with approximately 1 nA of beam current. Elemental maps were prepared using signals from scanning points that register within the narrow (55%) peak area of Sbz-Lα (3.603 eV), Cd-Lα (3.132 eV), Se-Kα (11.210 eV), and Cl-Kα (2.621 eV). Atomic weight percent of each element was calculated in Bruker Espirit 1.9 from the integrated spectra using the Cliff-Lorimer ratio method.

h. Elemental Analysis

Figure 3A:
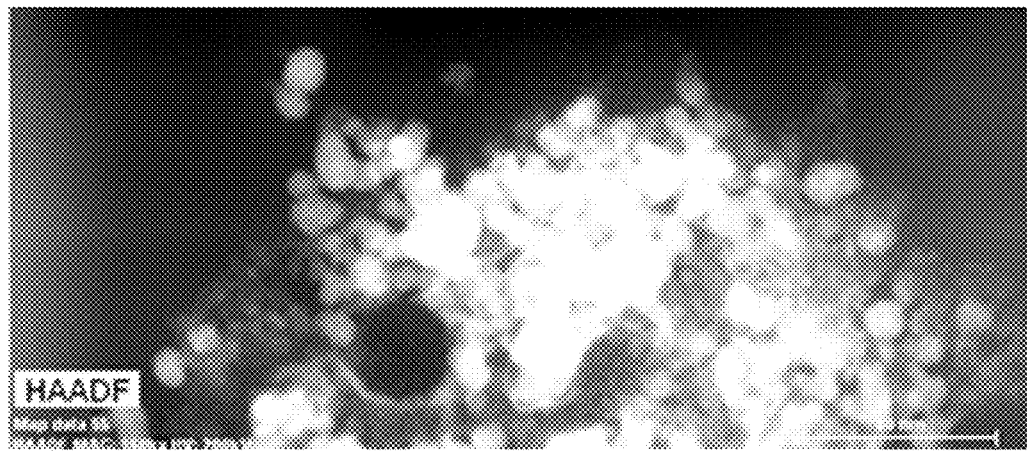
FIG. 3A-F shows transmission electron micrographs (TEM) and energy dispersive elemental maps of ferroelectric agglomerates formed from CdSe nanoparticles that have been treated with $SbCl_3$.
Figure 3B:
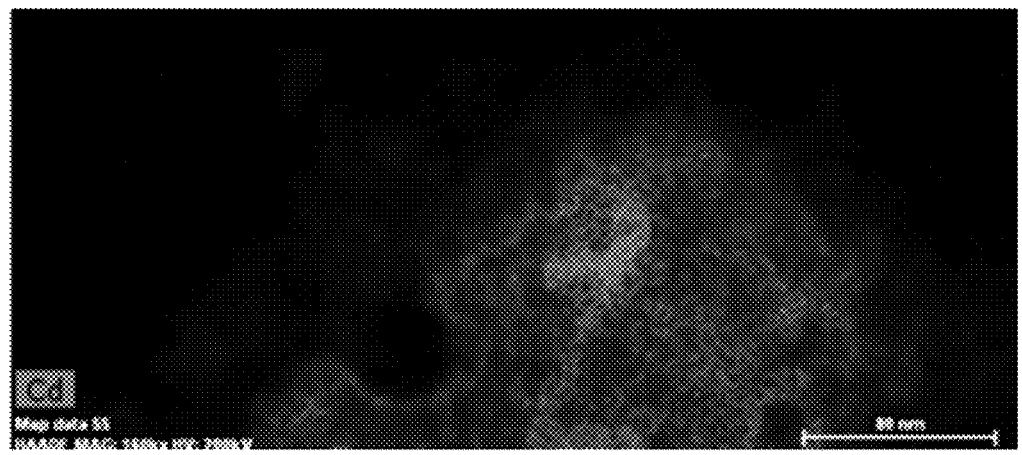
Figure 3C:
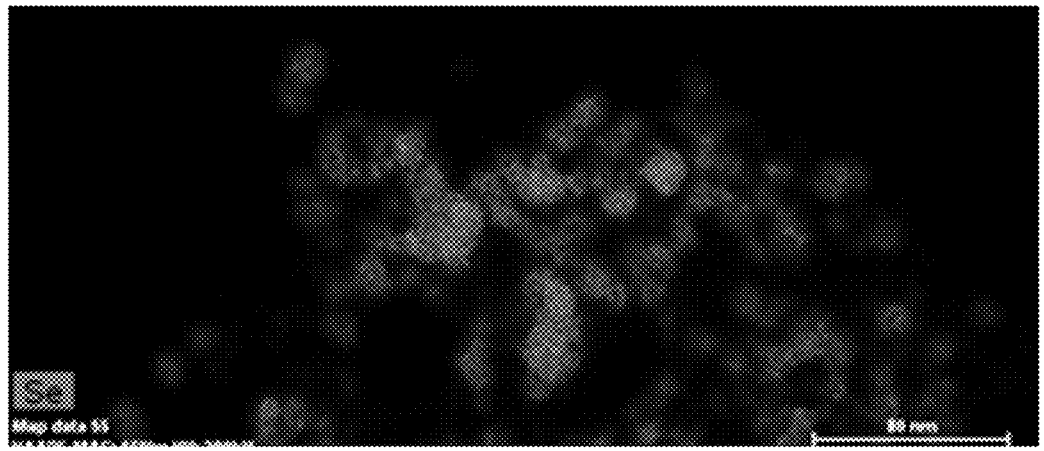
Figure 3D:
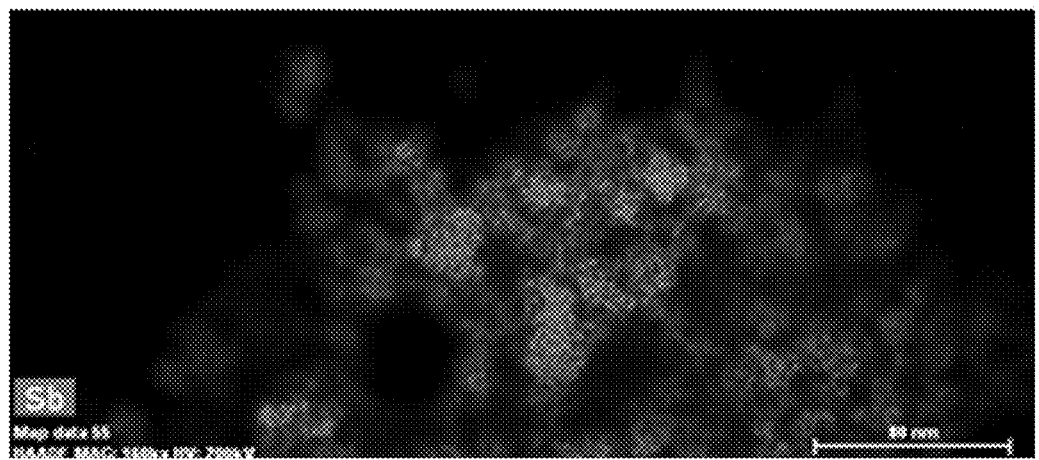
Figure 3E:
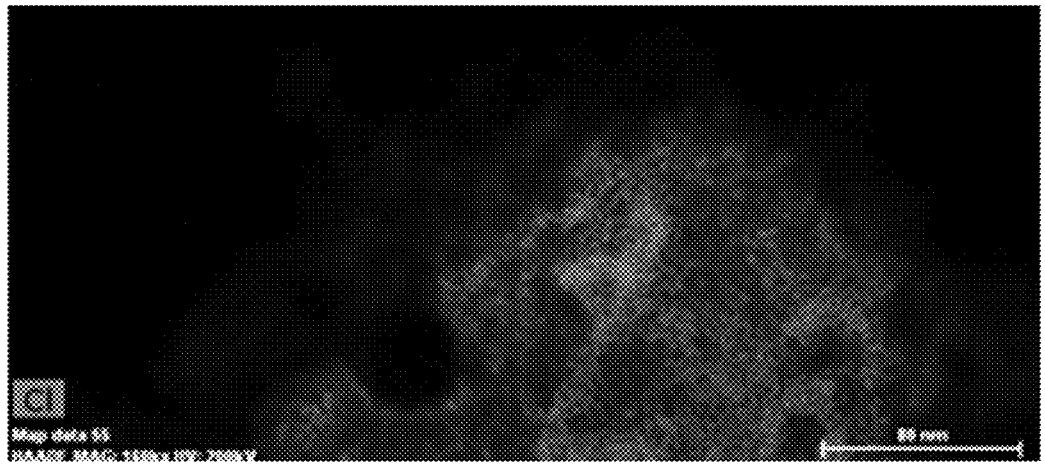
Figure 3F:
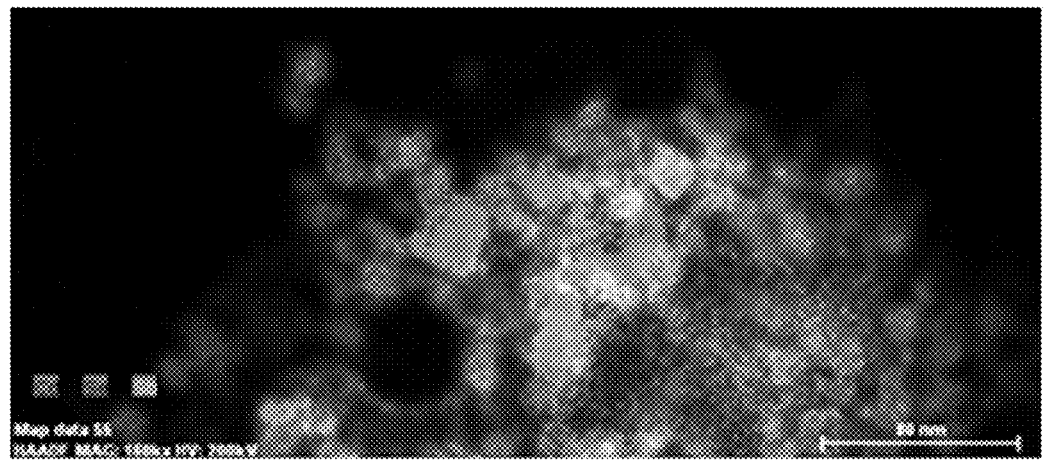
Figure 3G:
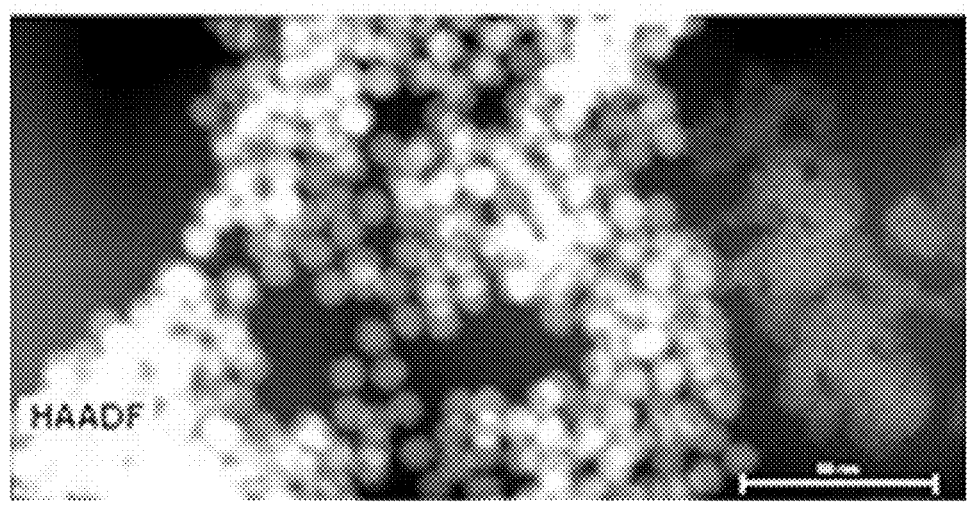
FIG. 3G-3L shows transmission electron micrographs (TEM) and energy dispersive elemental maps of ferroelectric agglomerates formed from $Fe_2O_3$ nanoparticles that have been treated with $SbCl_3$.
Figure 3H:
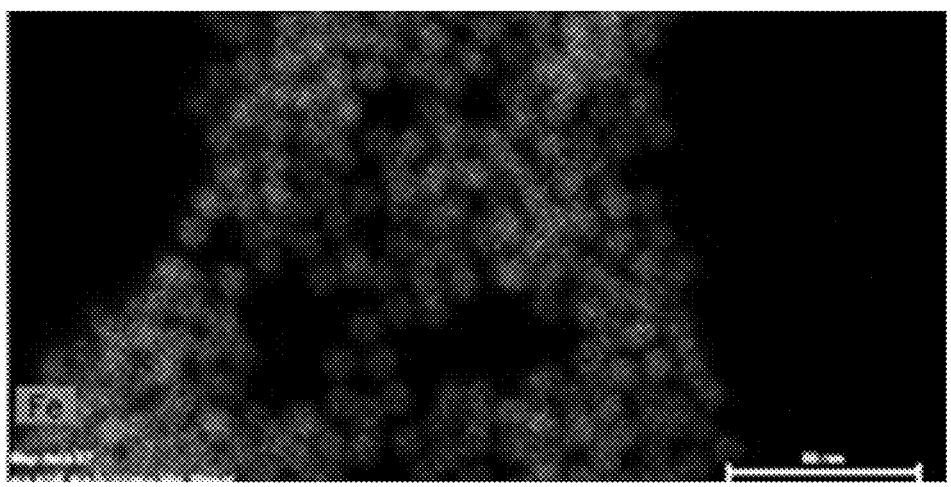
Figure 3I:
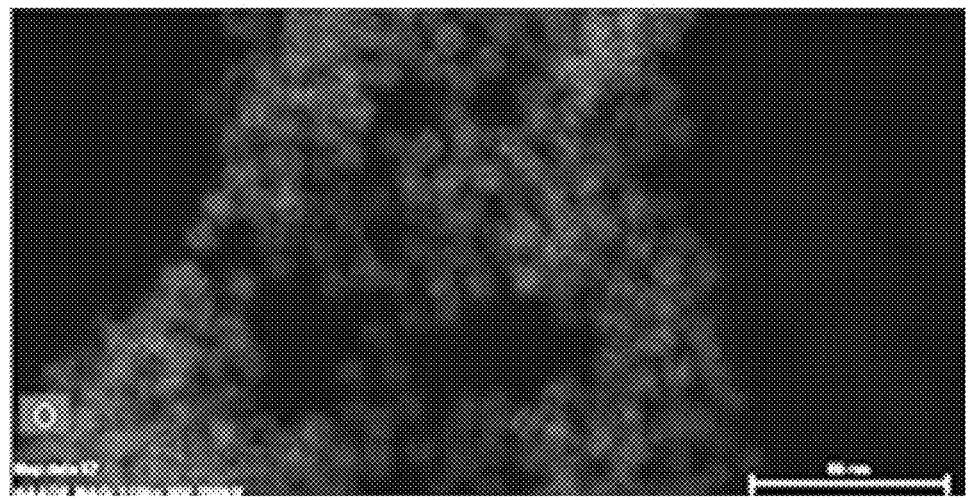
Figure 3J:
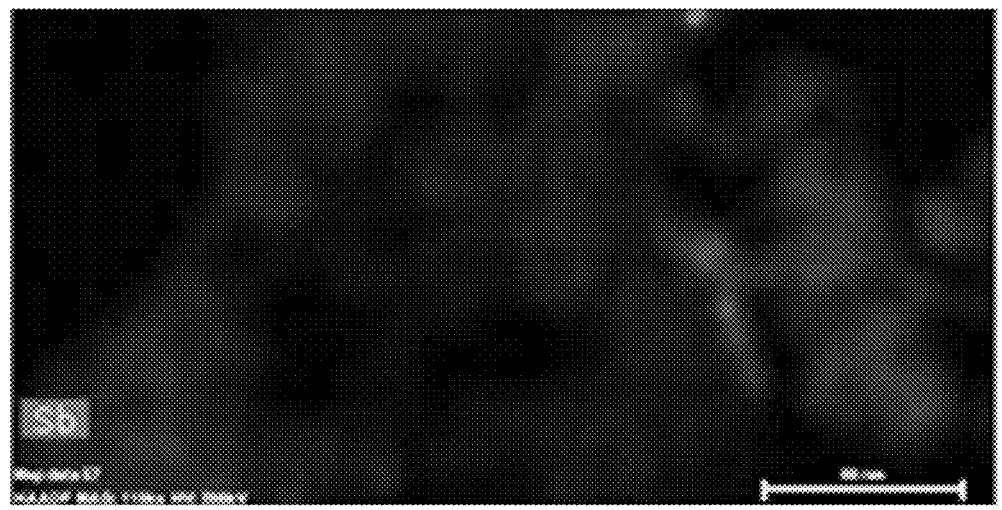
Figure 3K:
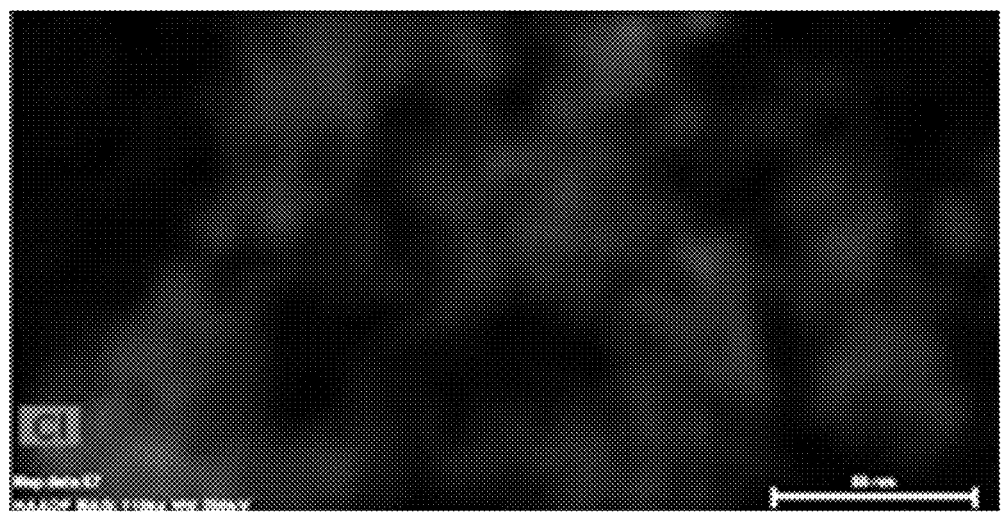
Figure 3L:
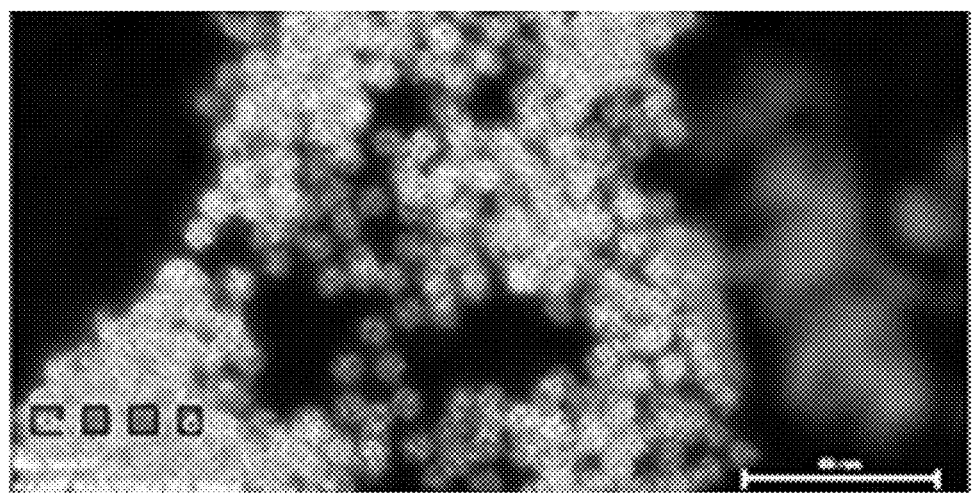

Elemental analysis of ferroelectric agglomerates formed from CdSe nanoparticles treated with $SbCl_3$, made as described above, has been performed by Energy Dispersive Elemental Maps. FIG. 3A-3F show the elemental dispersion of Cd (FIG. 3B), Se (FIG. 3C), Sb (FIG. 3D), and Cl (FIG. 3E) in the ferroelectric agglomerate (FIGS. 3A and 3F).

i. Ferroelectric Properties

Figure 4A:
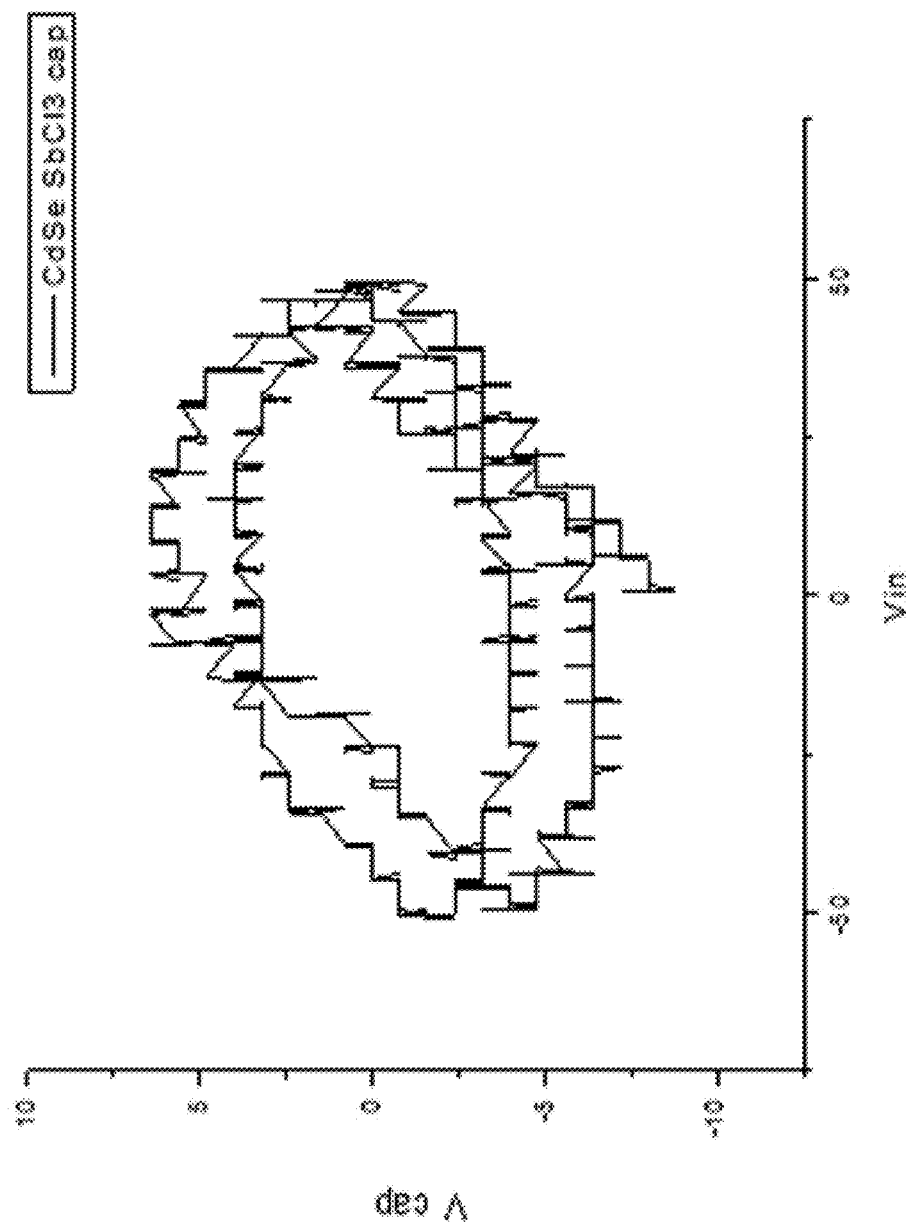
FIG. 4A-D show Sawyer-Tower circuits showing the dipole reversibility for FIG. 4A ferroelectric agglomerates formed from CdSe nanoparticles treated with $SbCl_3$, FIG. 4B CdSe nanoparticles, FIG. 4C. ferroelectric agglomerates of FIG. 4A one month after casting the film, and FIG. 4D bare Au electrode.
Figure 4B:
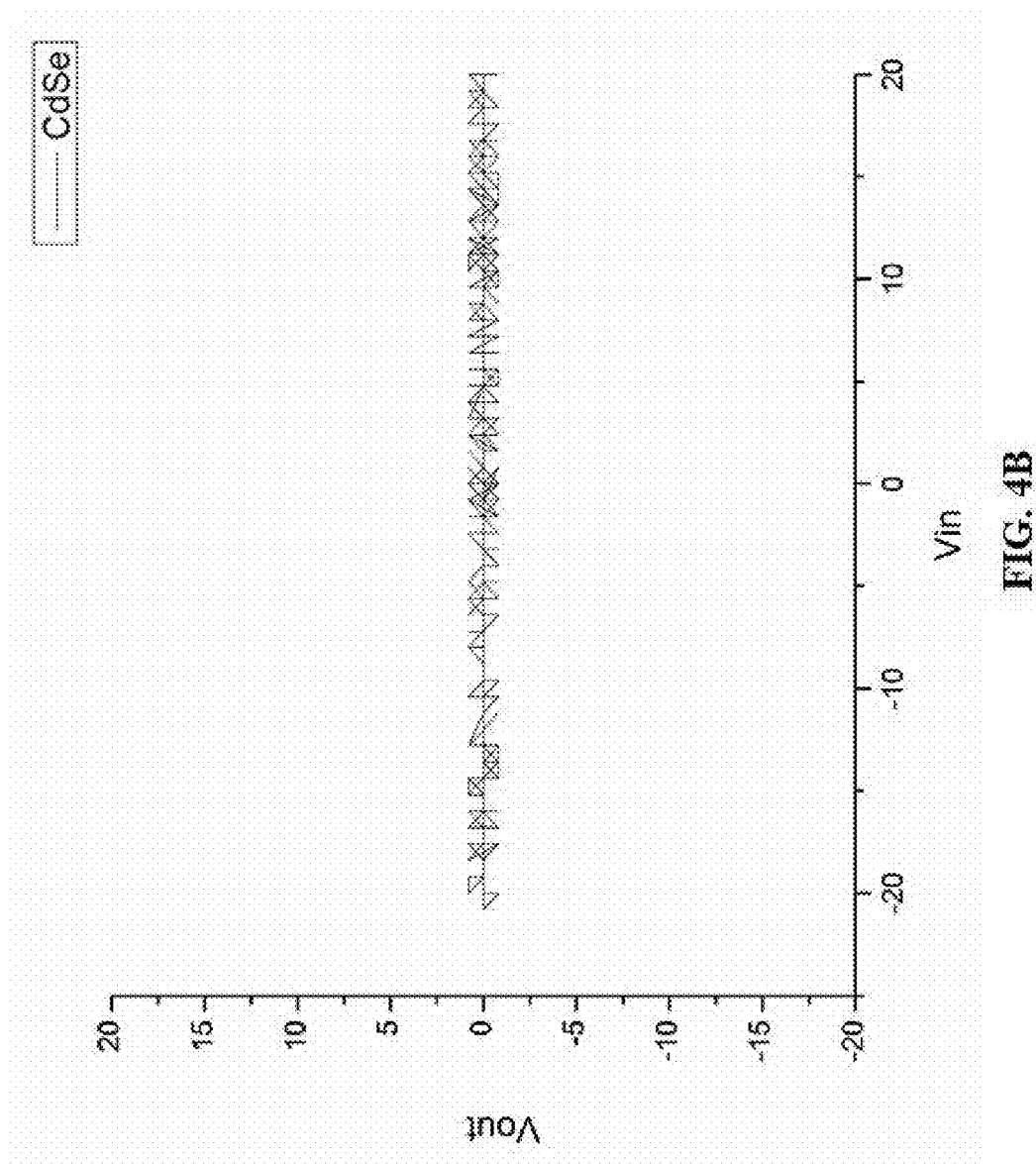
Figure 4C:
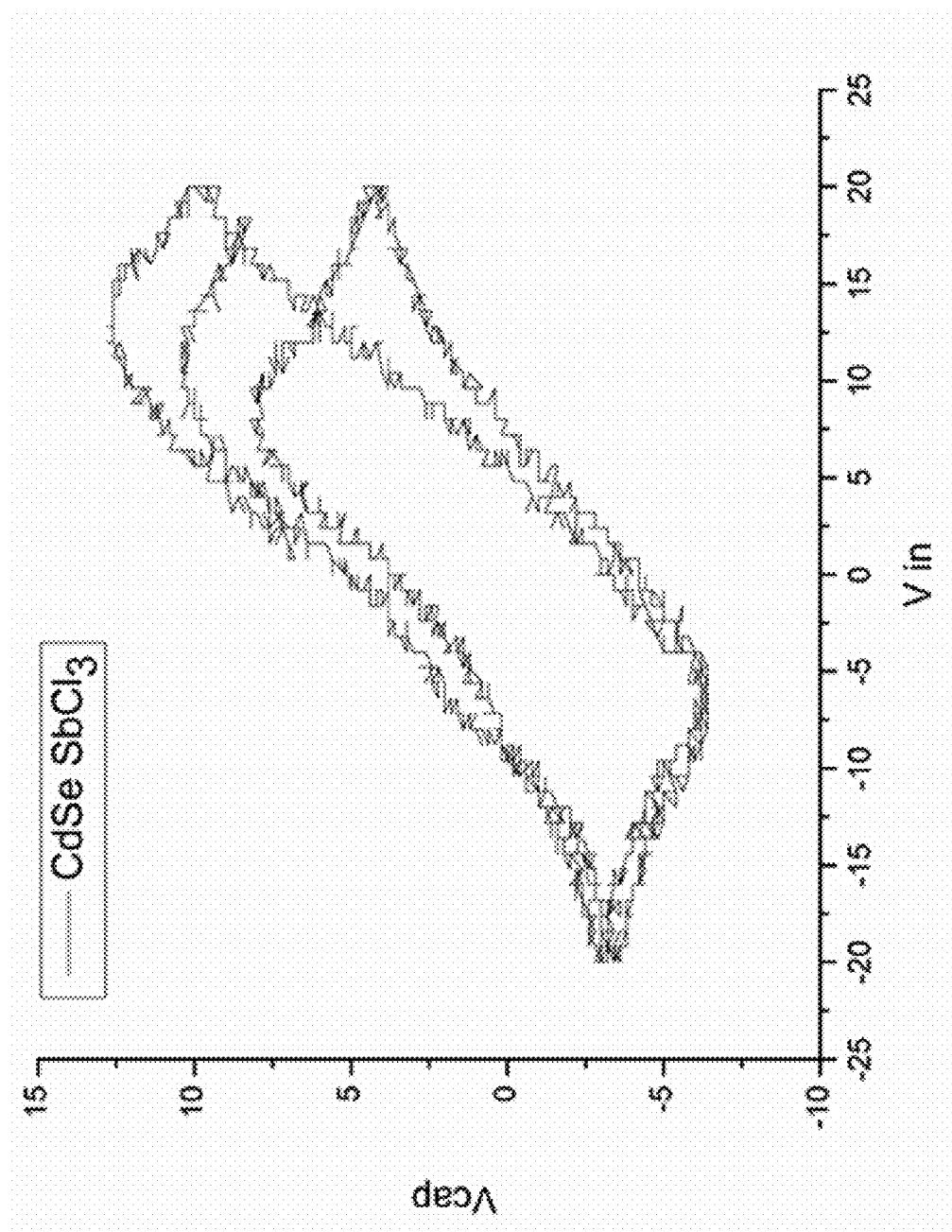
Figure 4D:
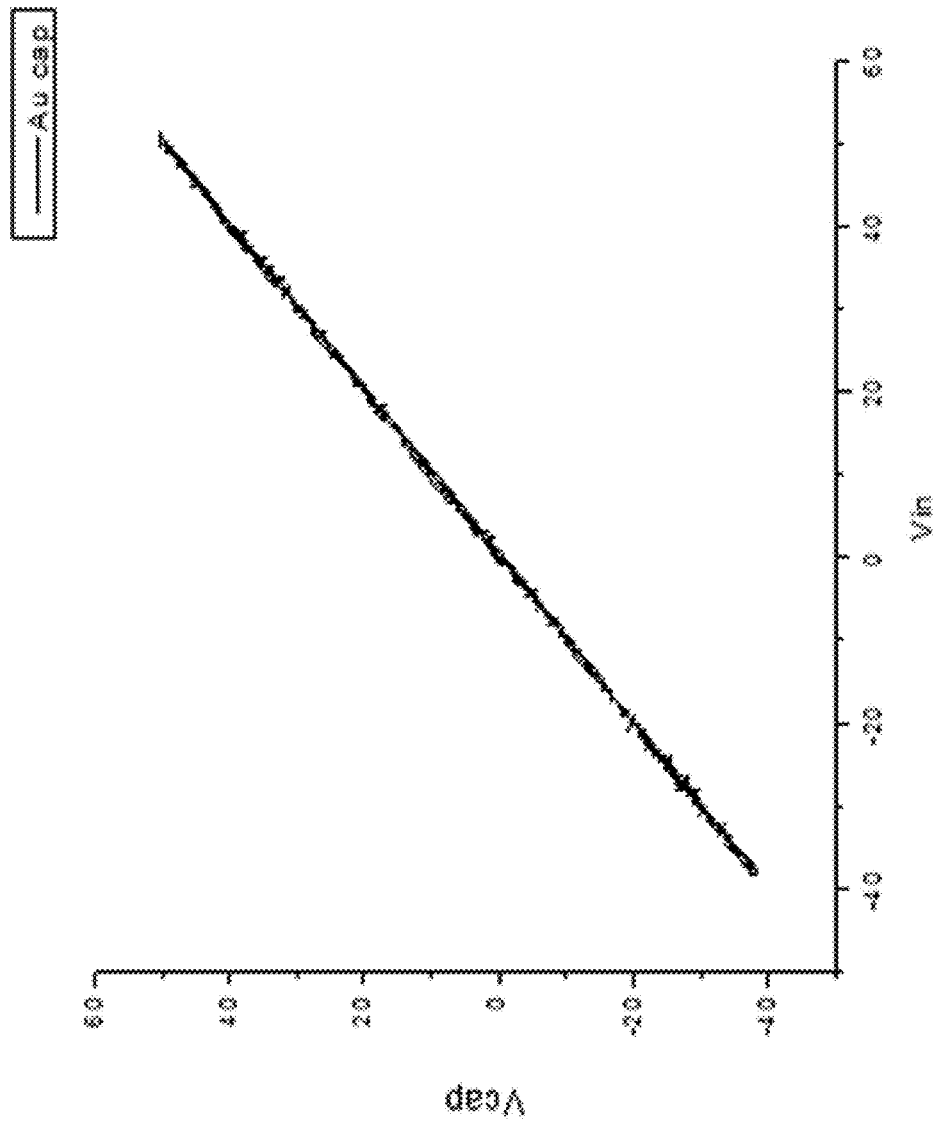

FIG. 4A-4D shows the ferroelectric properties of the agglomerates described herein. FIG. 4A shows the dipole reversibility of agglomerates formed from CdSe nanoparticles treated with $SbCl_3$. FIG. 4B shows that at CdSe nanoparticles do not possess ferroelectric properties. FIG. 4C shows the dipole reversibility one month after the agglomerates from FIG. 4A were formed. Thus, the dipole reversibility of the agglomerates is retained over time. FIG. 4D shows that an Au electrode does not possess ferroelectric properties.

j. Glancing Angle X-Ray Diffraction

Figure 5:
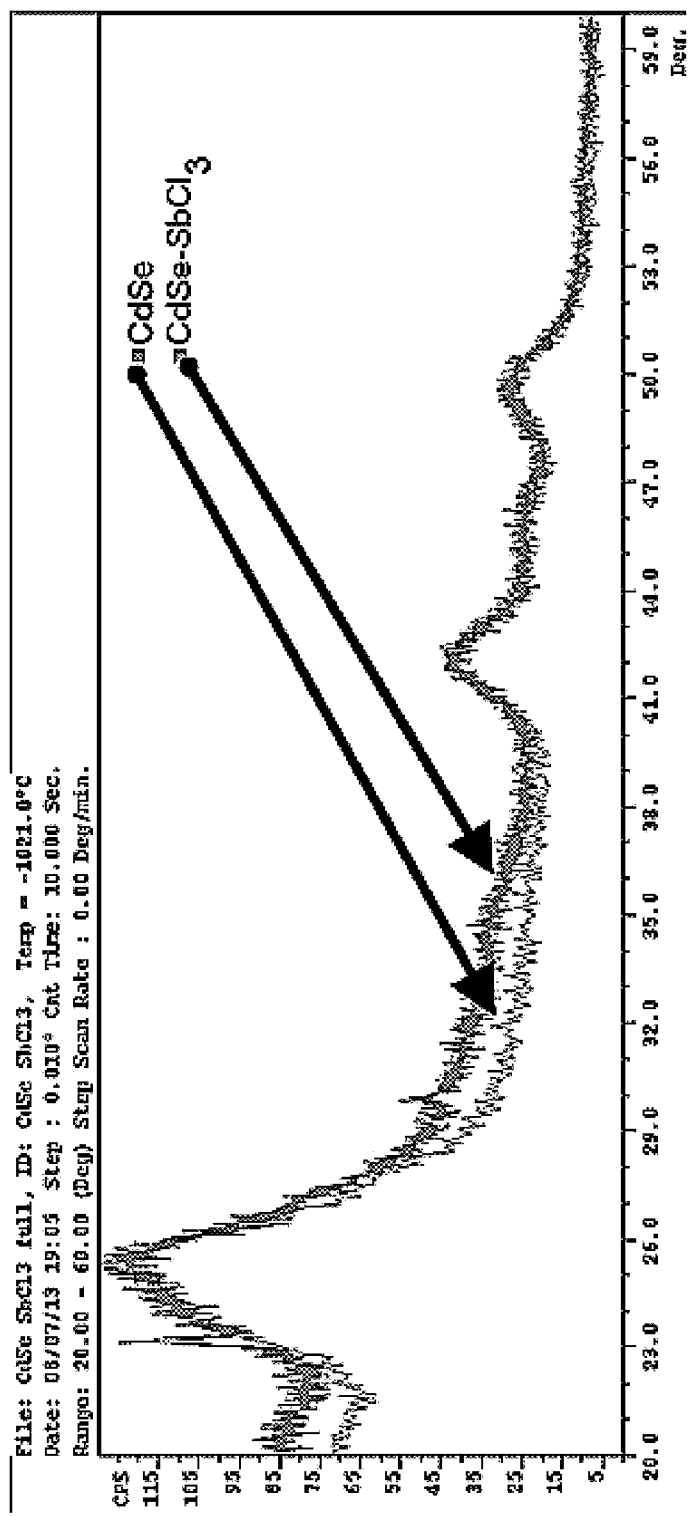
FIG. 5 shows glancing angle x-ray diffraction patterns of ferroelectric agglomerates formed from CdSe nanoparticles that have been treated with $SbCl_3$, and of CdSe nanoparticles.

FIG. 5 shows the glancing angle x-ray diffraction patterns of ferroelectric agglomerates formed from CdSe nanoparticles that have been treated with $SbCl_3$, compared to the glancing angle x-ray diffraction patterns of CdSe nanoparticles. X-ray diffraction studies indicate the introduction of a crystalline material after treatment of CdSe nanoparticles with $SbCl_3$, as denoted by the appearance of a strong peak at 23°.

k. Effect of Heat Treatment on Ferroelectric Agglomerates

Figure 6A:
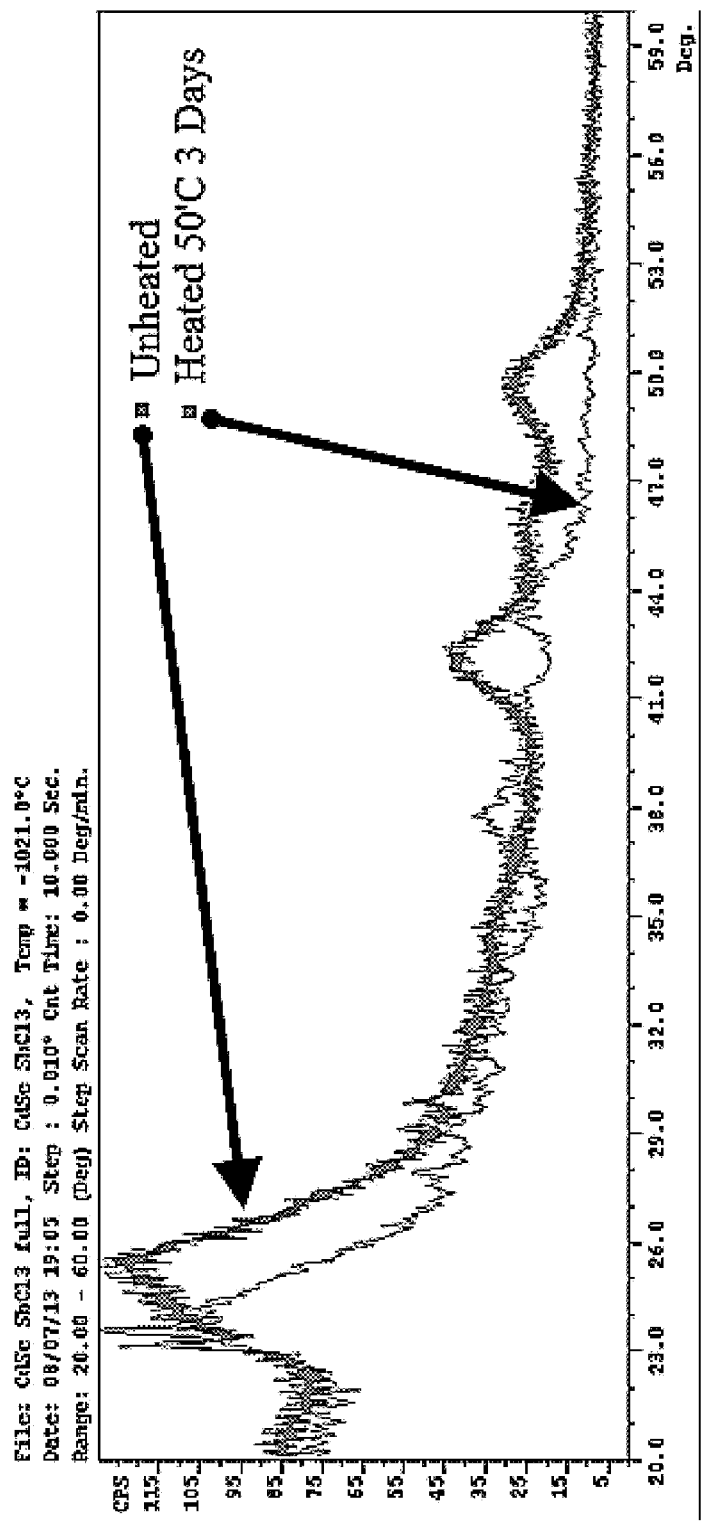
FIG. 6A and FIG. 6B show glancing angle x-ray diffraction patterns of unheated ferroelectric agglomerates formed from CdSe nanoparticles treated with $SbCl_3$ and ferroelectric agglomerates formed from CdSe nanoparticles treated with $SbCl_3$ subjected to heating at 50° C. for 3 days or 80° C. for 4 days.
Figure 6B:
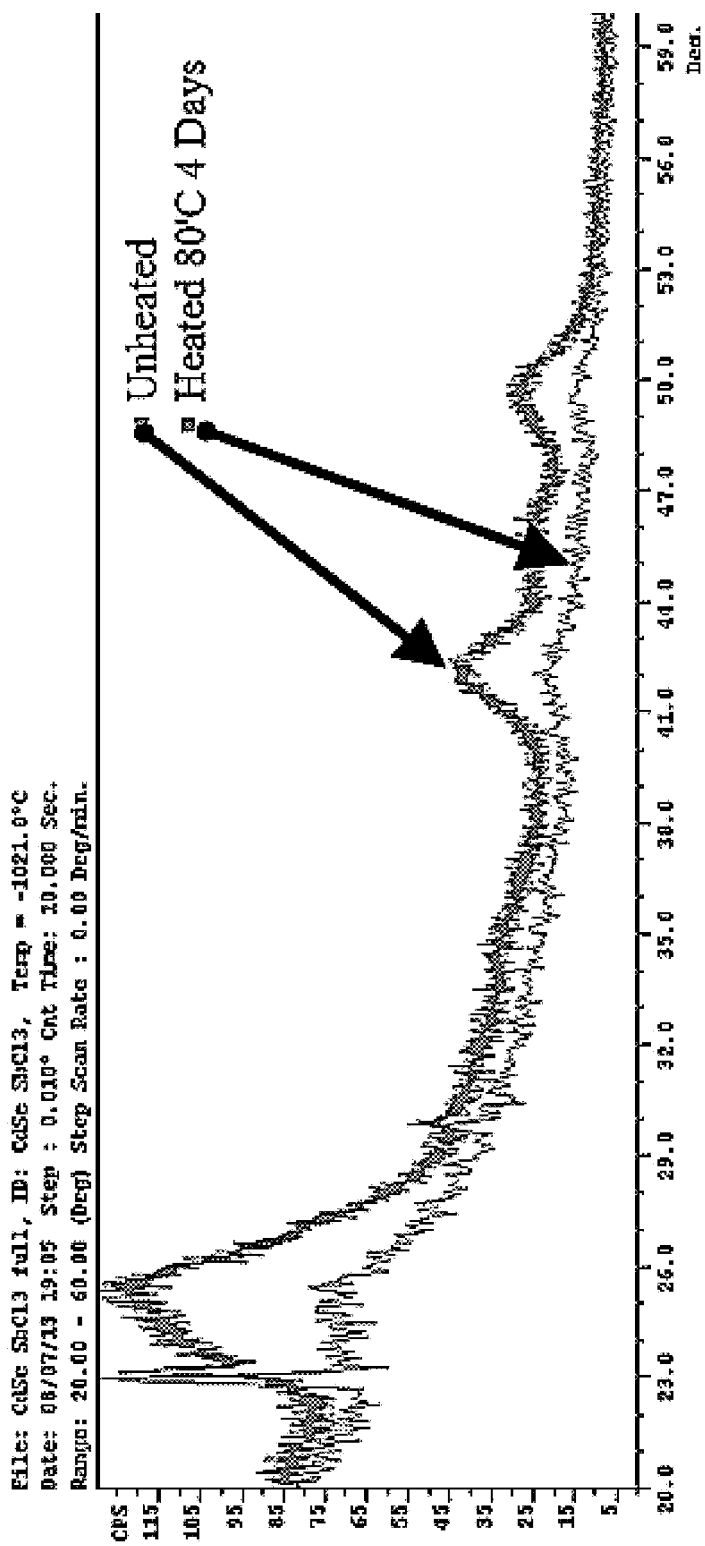

Heat treated ferroelectric agglomerates formed from CdSe nanoparticles treated with $SbCl_3$ have been investigated. The glancing angle x-ray diffraction patterns of heated and non-heated ferroelectric agglomerates are shown in FIGS. 6A and 6B. The shifting of peaks after heat-treatment indicates that alloying is occurring between the CdSe particles and the crystalline matrix. The allotting results from in a complete cationic-exchange between CdSe and $SbCl_3$. Transmission electron microscopy coupled with energy dispersive wavelength analysis reveals that after treating CdSe nanoparticles with $SbCl_3$, agglomerates are formed within a semi-crystalline matrix.

1. Evaluation of Quantum Dots Treated with $SbCl_3$

Several different agglomerates have been made from nanoparticles comprising a body and a surface ligand and have been treated with $SbCl_3$, following the procedure described above. The agglomerates were tested form responsiveness to a static electric field. The results are summarized in Table 1.

TABLE 1

| Nanoparticle body | Surface Ligand | Produce static responsive agglomerates? |
|---|---|---|
| CdSe | Oleic Acid | yes |
| PbS | Oleic Acid | yes |
| $Fe_3O_2$ | Oleic Acid | yes |
| ZnO | Oleic Acid | yes |
| CdSe—CdS | Oleic Acid | yes |
| CdSe—CdS (graded) | Oleic Acid | yes |
| CdSe—ZnS | Oleic Acid | yes |
| Au | Citrate | yes |
| Ag | Citrate | yes |
| $AgInS_2$—ZnS | Oleyamine | yes |
| ZnCuInS—ZnS | Dodecanethiol | yes |
| ZnCuInS—ZnS | Mercaptoundecanoic acid | yes |
| Au | Cysteamine and Glutathione | yes |
| $AgInS_2$—ZnS | Glutathione | yes |
| CdTe—CdS | Glutathione | yes |
| CdSe | Dodecylphosphonic acid | no |
| $CuInS_2$ | Dodecyl-3-mercaptopropionate | no |
| CdTe—CdS | Mercaptosuccinic acid | no |
| SnS | Dodecanethiol | no |
| EuS | Dodecanethiol | no |

2. Preparation of Ferroelectric Agglomerates—Example 2

Figures 7A, 7B, 7C:
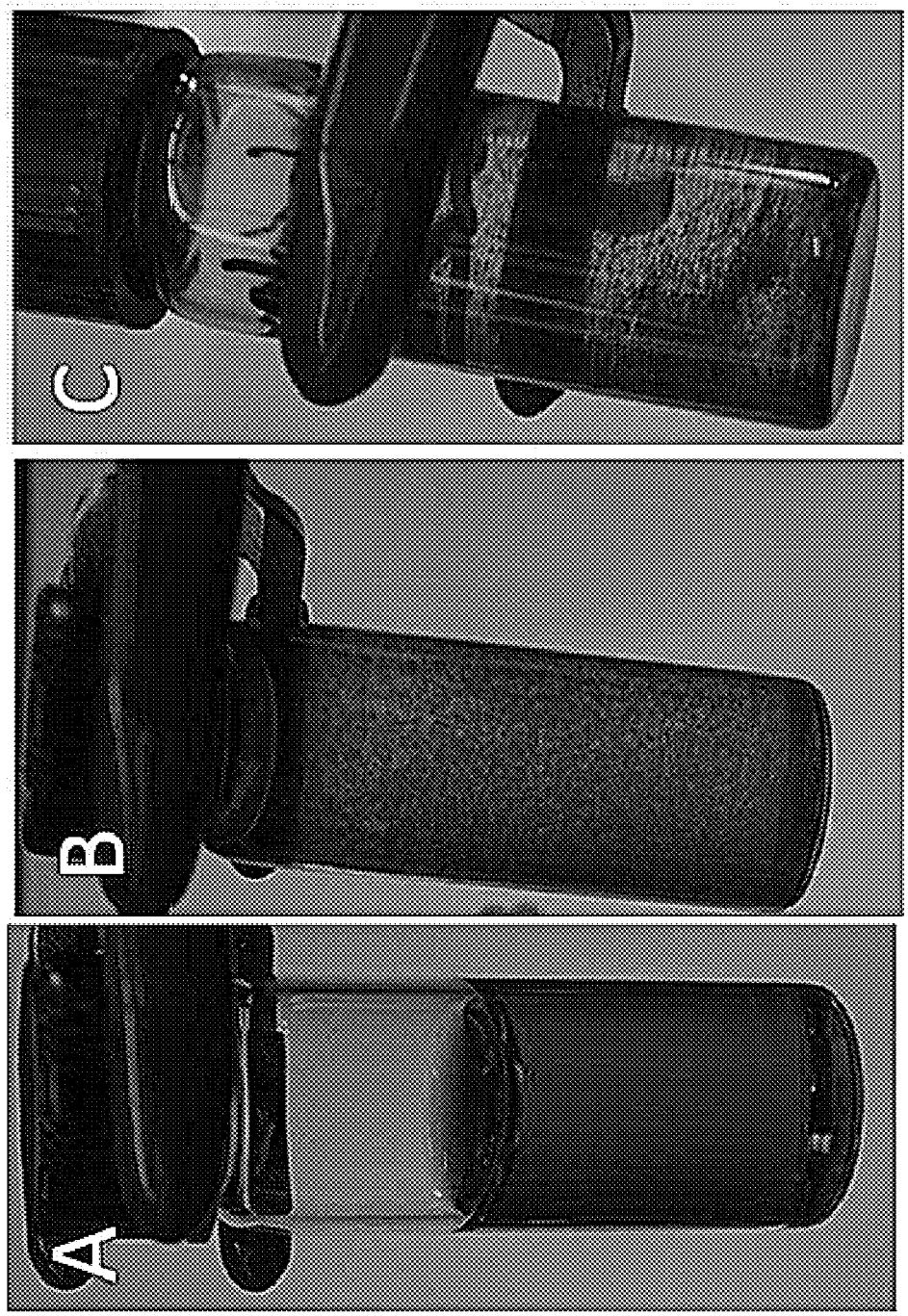
FIG. 7A-C show representative images of CdSe quantum dots (FIG. 7A) treated with $SbCl_3$ for 1 min (FIG. 7B) and for 12 hrs (FIG. 7C). CdSe treated for 1 min shows small agglomerates flocculating together suspended in toluene; whereas, the CdSe treated for 12 hrs displays large agglomerates precipitated out of toluene.

Colloidal CdSe quantum dots (size 4.3 nm) were synthesized using the well-established reaction of cadmium oleate with selenium and purified using a toluene/ethanol wash followed by a toluene/acetone wash (Schreuder et al. (2009) *J. Phys. Chem. C* 1: 2618-2638). A portion of the clean QDs were dried under vacuum and saved for future characterization. The rest of the QDs were diluted in toluene to a concentration of 2.5 mM, as determined by UV-vis spectroscopy. An equimolar solution of $SbCl_3$ was prepared by dissolving 60 mg of $SbCl_3$ in 100 mL of toluene. Upon mixing equal volumes of the two solutions at room-temperature, the suspended QDs underwent two distinct phases of solubility loss (FIG. 7A-7C).

Initially, the particles flocculated together but remained suspended in the nonpolar solvent. As time progressed, the flocculates became much larger (up to 100+ µM) and precipitated out of solution. To assess reaction progress, samples of the product were purified after 1 min and after 12 h of exposure to $SbCl_3$. The particles were purified to remove any excess unreacted materials by three cycles of centrifugation in toluene at 8 krpm for 1 min followed by resuspension in toluene; cleanliness was monitored relative to the presence of $Cl^-$ by reacting the supernatant after each wash cycle with $AgNO_3$ until a precipitate was no longer observed. For characterization techniques requiring dry samples—attenuated total reflectance infrared spectroscopy (ATR-IR) and thermogravimetric analysis (TGA)—samples of the clean pellets were dried under vacuum.

Figure 8:
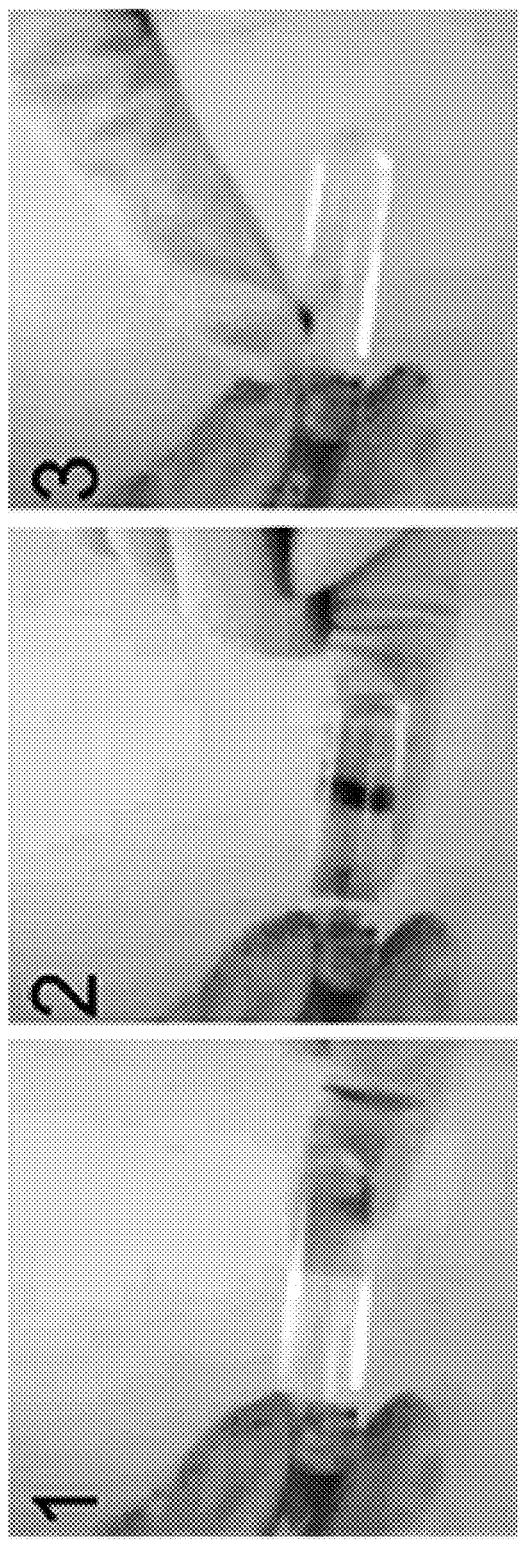
FIG. 8 shows a representative series of images of $SbCl_3$-treated CdSe particles translocating in the electric field generated by a gloved finger.

The particles treated for 12 h demonstrated extremely large net polarizations, sensitive enough to migrate in response to the electric field generated by a gloved finger (FIG. 8).

3. Polarization Response

Polarization response was measured utilizing a sandwich cell consisting of two indium tin oxide-coated glass slides separated by a 20 µM spacer with an active area of 0.19 $cm^2$, compressed around a concentrated paste of the particles in n-heptane (Basun et al. (2011) *Condens. Matter Mater. Phys.* 84: 024105/1-024105/8). The sandwich cells were connected into the traditional Sawyer-Tower circuit with a triangular waveform of ±10 V applied to the circuit.

Figure 9:
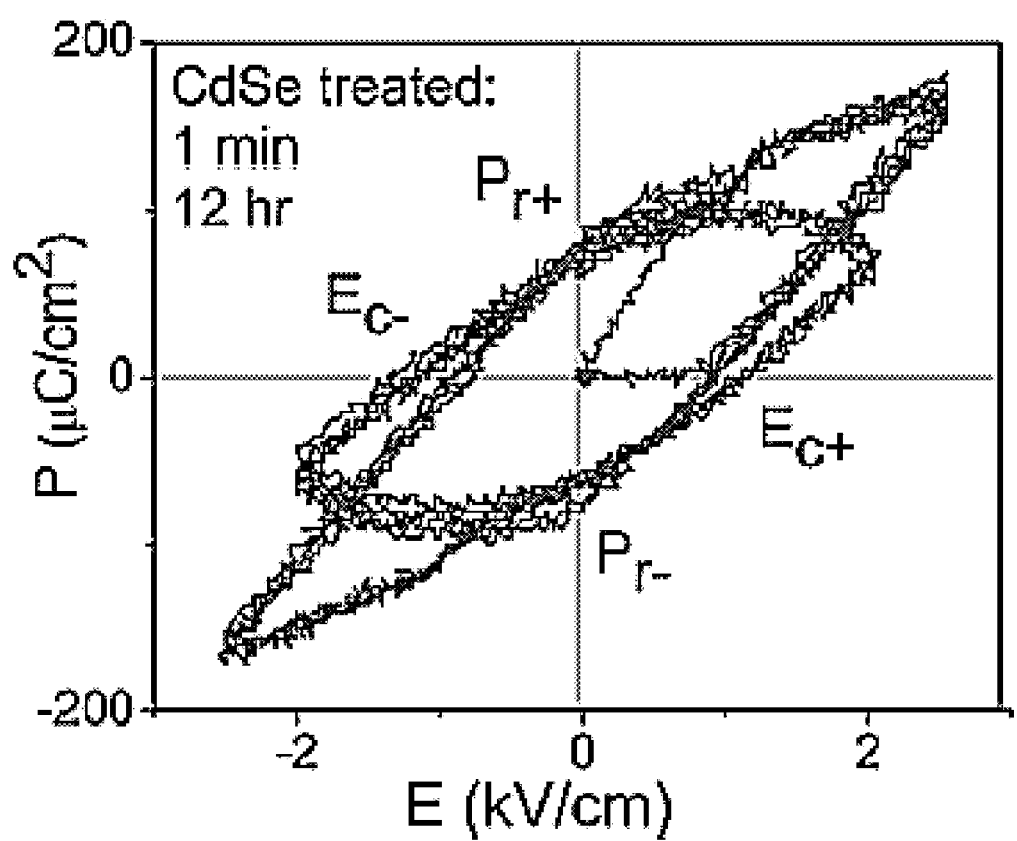
FIG. 9 shows a representative polarization response within an applied electric field for CdSe quantum dots treated with $SbCl_3$ for 1 min and for 12 hrs with the remnant polarization ($P_r$) and coercive electric field ($E_c$) indicated.
Figure 10:
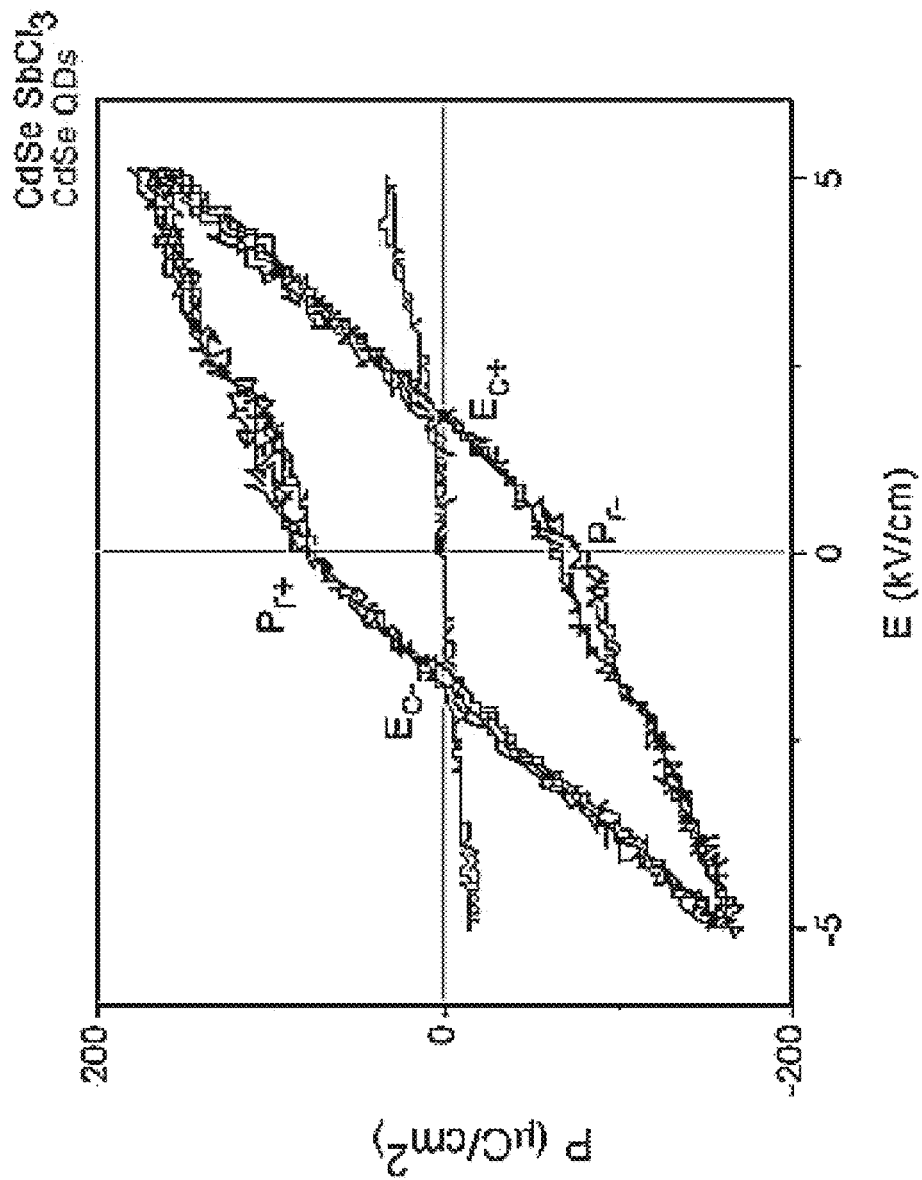
FIG. 10 shows a representative polarization response within an applied electric field for CdSe quantum dots and CdSe quantum dots treated with $SbCl_3$ for 12 hrs with the remnant polarization ($P_{r+,-}$) and coercive electric field ($E_{c+,-}$) indicated.

The voltage input and the voltage drop across a 4.7 µF reference capacitor in series with the cell were used to determine the polarization and electric field across the samples (FIG. 9). $SbCl_3$-treated CdSe displayed an obvious hysteretic behavior, a signature of ferroelectrics, with a maximum remnant polarization ($P_r$) of 80 $\mu C/cm^2$ and a coercive electric field ($E_c$) of 2 kV/cm obtained with the sample treated for 12 h. These values are comparable to other known ferroelectrics, notably $BiFeO_3$ (Wang et al. (2011) *Appl. Phys. Lett.* 98: 192901/1-192901/3), $BaTiO_3$ (Zhang (2012) *Condens. Matter* 1-18), and $PbTiO_3$ (Ricinschi et al. (2006) *Zairyo* 55: 169-172). Untreated CdSe QDs responses display a closed loop with no remnant polarization (the polarization of the cell is always zero when the applied field is zero) (FIG. 10). CdSe is a thermoelectric with a spontaneous polarization reported (Schmidt et al. (1997) *J. Chem. Phys.* 106: 5254-5259; Nann and Schneider (2004) *Chem. Phys. Lett.* 384: 150-152) to range from 0.2 to 0.6 $\mu C/cm^2$, which is too small to be observed in the unamplified signals collected in this study. Without wishing to be bound by theory, it may be possible to improve the properties of the particles and thereby generate responses tunable for specific needs.

4. Explanation of the Phases of Flocculation

To find the source of the ferroelectric response and explain the two observed phases of flocculation, scanning transmission electron micrographs with energy dispersive X-ray spectroscopy elemental maps (STEM-EDS), ATR-IR, TGA, XRD, SEM-EDS, and ICP-OES were performed on untreated CdSe QDs and CdSe QDs treated with $SbCl_3$ for 1 min and for 12 h.

Figure 11A:
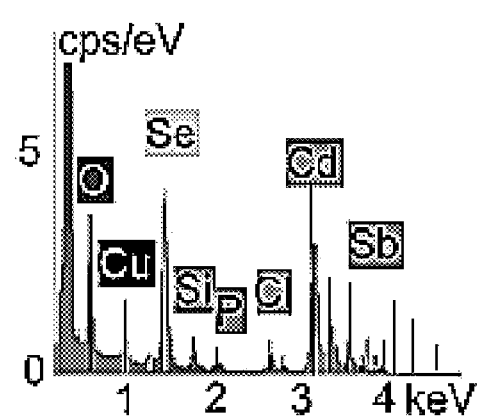
FIG. 11A and FIG. 11B show representative STEM HAADF images, EDS spectra, and elemental maps of CdSe quantum dotes treated with $SbCl_3$ for 1 min (FIG. 11A) and for 12 hrs (FIG. 11B).
Figure 11A:
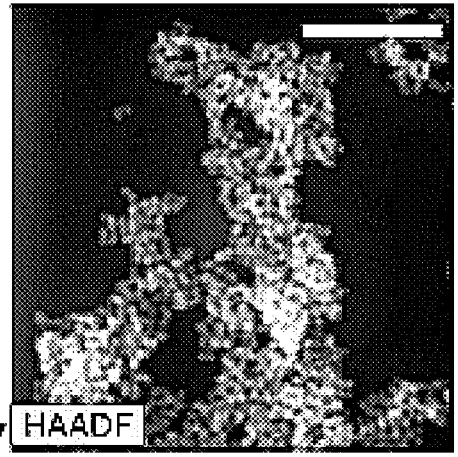
Figure 11A:
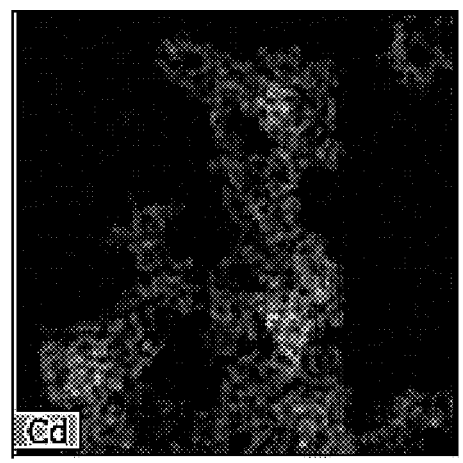
Figure 11A:
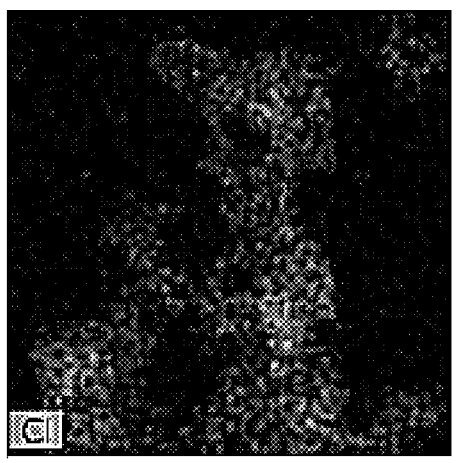
Figure 11A:
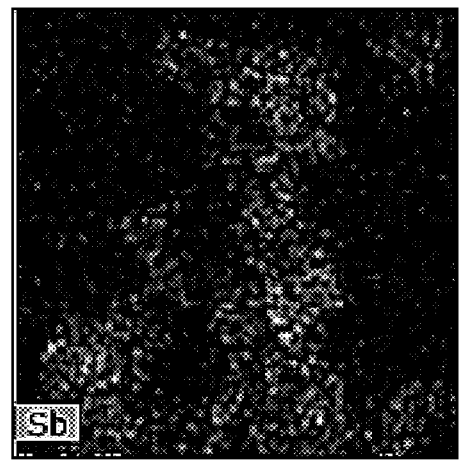
Figure 11A:
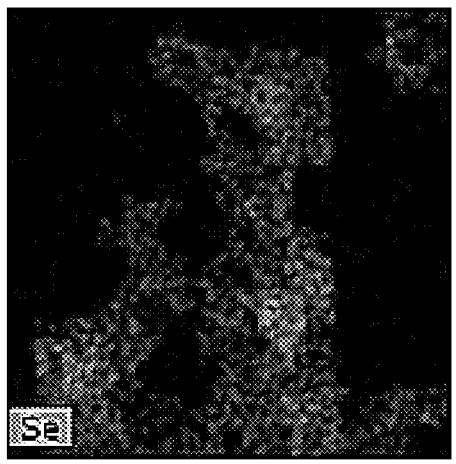
Figure 11B:
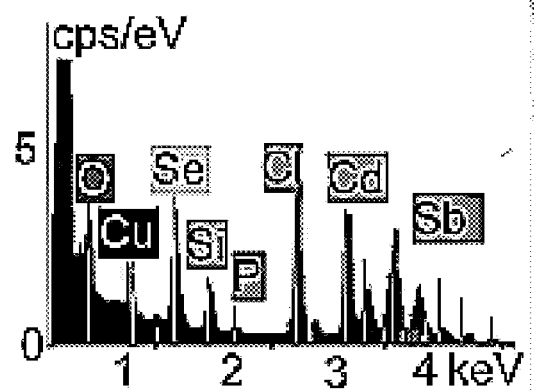
Figure 11B:
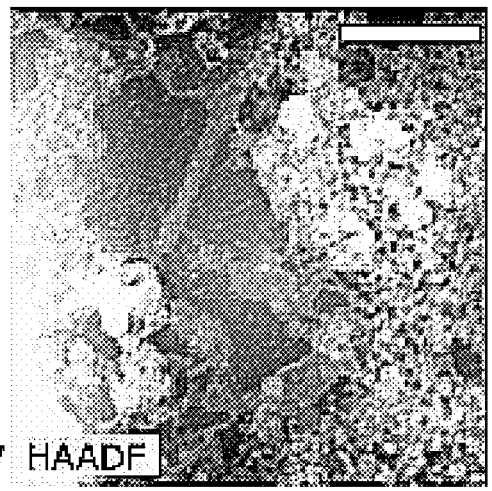
Figure 11B:
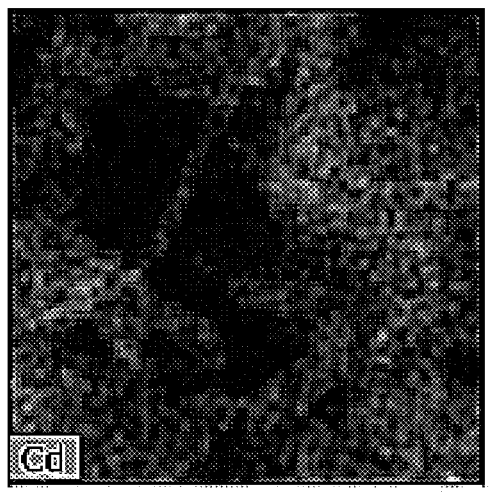
Figure 11B:
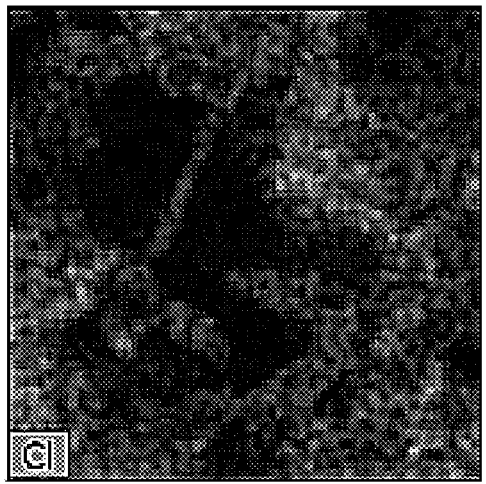
Figure 11B:
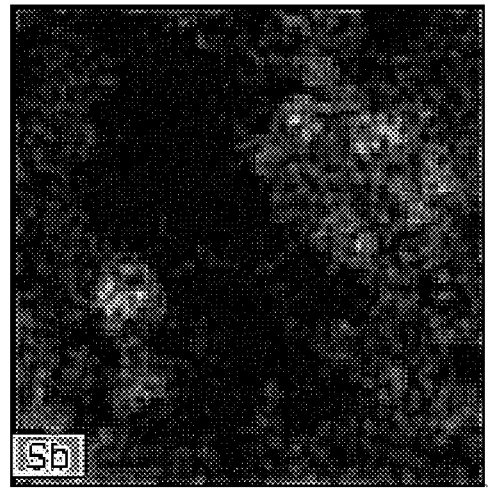
Figure 11B:
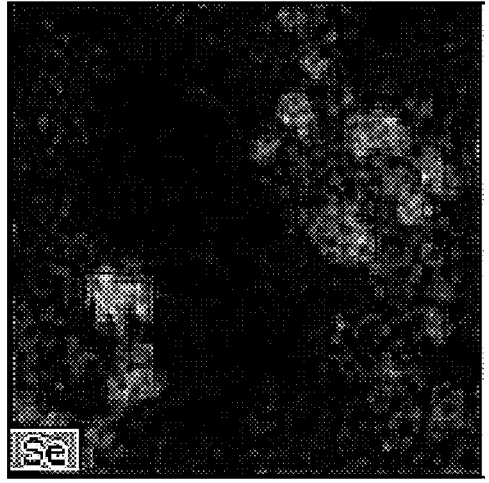

STEM-EDS maps and spectra of CdSe QDs treated with $SbCl_3$ for 1 min and for 12 h elucidate the two phases of the reaction that produced the ferroelectric particles (FIG. 11A and FIG. 11B). An initial ligand disruption and replacement by $Cl^-$ was readily observed in the sample treated for 1 min. Cl is localized with the agglomerates of CdSe; however, individual QDs were still distinguishable, and a very low Sb signal barely above noise level was detected in the spectrum. The second phase is an unbalanced cation-exchange observable in the sample treated for 12 h as an overlap of the X-ray signals for Cd and Cl within a matrix surrounding overlapping signals from Sb and Se. The exchange was nontopotaxial as the anion subframe of the initial CdSe particles was not retained in the final product (Son et al. (2004) *Science* 306: 1009-1012), and therefore, it is possible that the particles may still contain Cd. Without wishing to be bound by theory, the maps indicated the probable formation of $CdCl_2$ and $Sb_2Se_3$ as predicted by the reaction shown below:

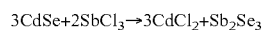

$$3CdSe + 2SbCl_3 \rightarrow 3CdCl_2 + Sb_2Se_3$$

However, as observed in X-ray diffraction patterns (FIG. 12A and FIG. 12B) and analysis of the elemental ratio of Sb:Se collected via inductively coupled plasma optical emission spectroscopy (Table 2) and energy dispersive C-ray spectroscopy (FIG. 13A and FIG. 13B), the final products are residual CdSe QDs, amorphous $Sb_xSe_y$, and $CdCl_2$.

TABLE 2

| Element | Weight % | Atomic % |
|---|---|---|
| C K | 8.01 | 31.03 |
| O K | 6.43 | 18.70 |
| Si K | 1.04 | 1.73 |
| P K | 0.60 | 0.90 |
| Cl K | 10.76 | 14.12 |
| Se L | 20.37 | 12.01 |
| Cd L | 42.16 | 17.47 |
| Sb L | 10.63 | 4.06 |
| Totals | 100.00 | |

Referring to FIG. 11A and FIG. 11B, representative STEM HAADF image, EDS spectra, and elemental maps of CdSe quantum dotes treated with $SbCl_3$ for 1 min (FIG. 11A) and for 12 hrs (FIG. 11B) are shown. The 1 min sample shows Cl around CdSe quantum dot agglomerates (FIG. 11A). The 12 h sample shows Cd and Cl surrounding particles containing Sb and Se (FIG. 11B). Scale bars: 40 μM.

Figure 12A:
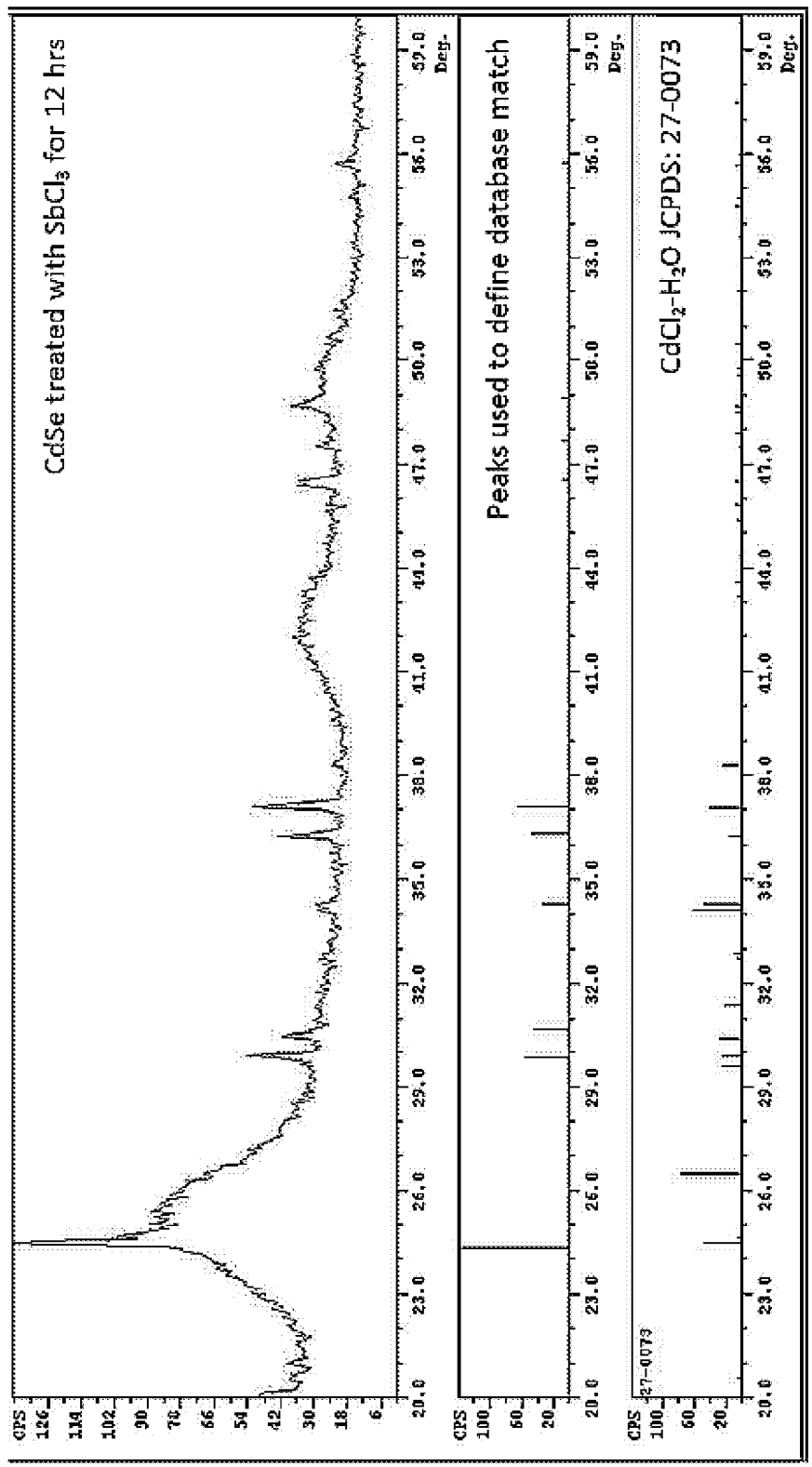
FIG. 12A and FIG. 12B show representative XRD with DMSNT ICDD (1997) compound matches of CdSe $SbCl_3$-treated for 12 hrs (FIG. 12A) and CdSe quantum dots (FIG. 12B) on (500) Si.
Figure 12B:
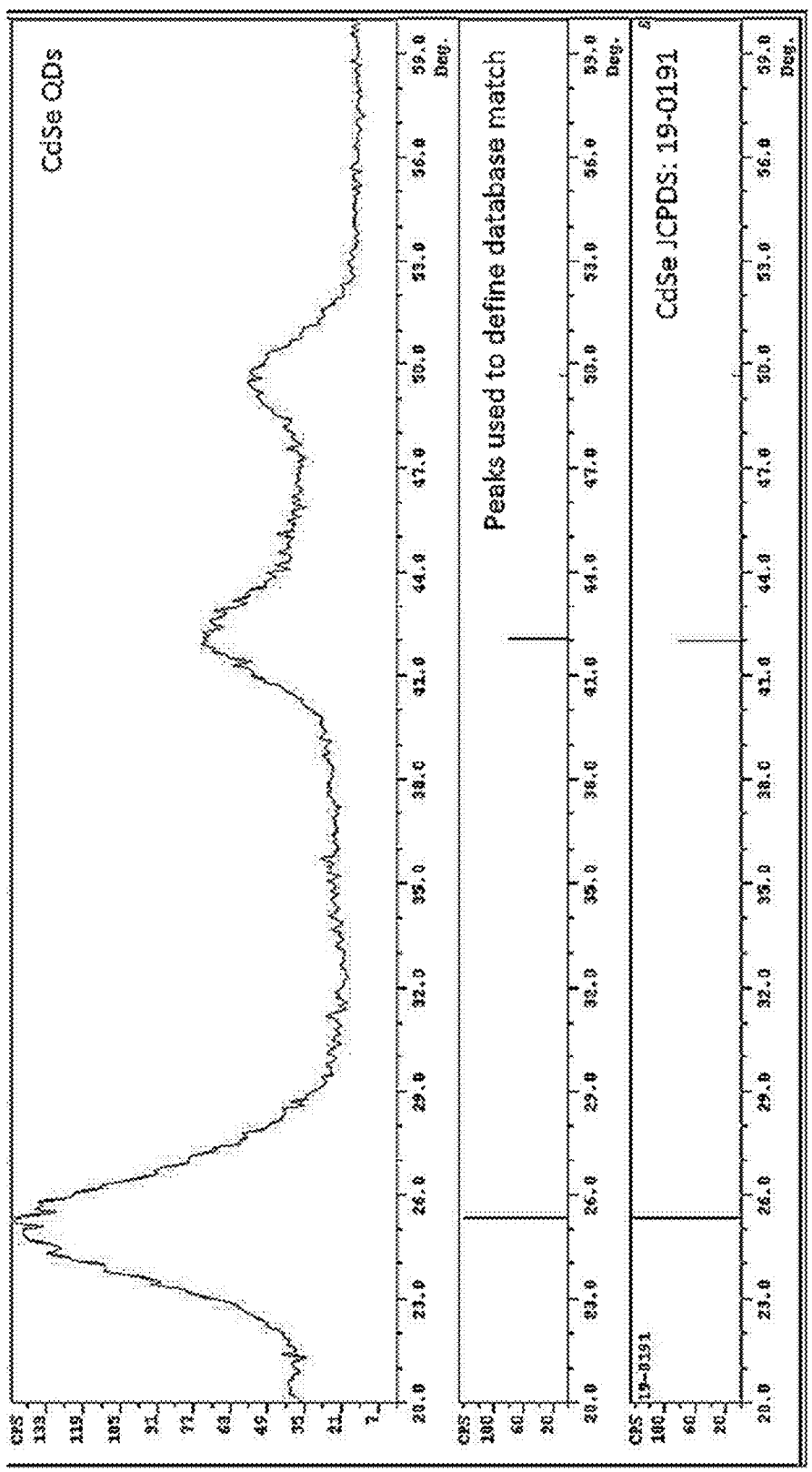

Referring to FIG. 12A and FIG. 12B, representative XRD with DMSNT ICDD (1997) compound matches of CdSe $SbCl_3$-treated for 12 hrs (FIG. 12A) and CdSe quantum dots (FIG. 12B) on (500) Si are shown. CdSe quantum dots display the typical broad peaks associated with wurtzite CdSe quantum dots (FIG. 12B). $SbCl_3$-treated CdSe reveals crystalline structure of $CdCl_2$—$H_2O$ and but no discernible features of crystalline $Sb_2Se_3$ (FIG. 12B). See Table 3.

TABLE 3

| | [Cd]/[Se] | [Sb]/[Se] | [Sb]/[Cd] |
|---|---|---|---|
| CdSe | 1.55 | 0.00 | 0.00 |
| CdSe SbCl3 | 1.45 | 0.27 | 0.19 |

Figure 13A:
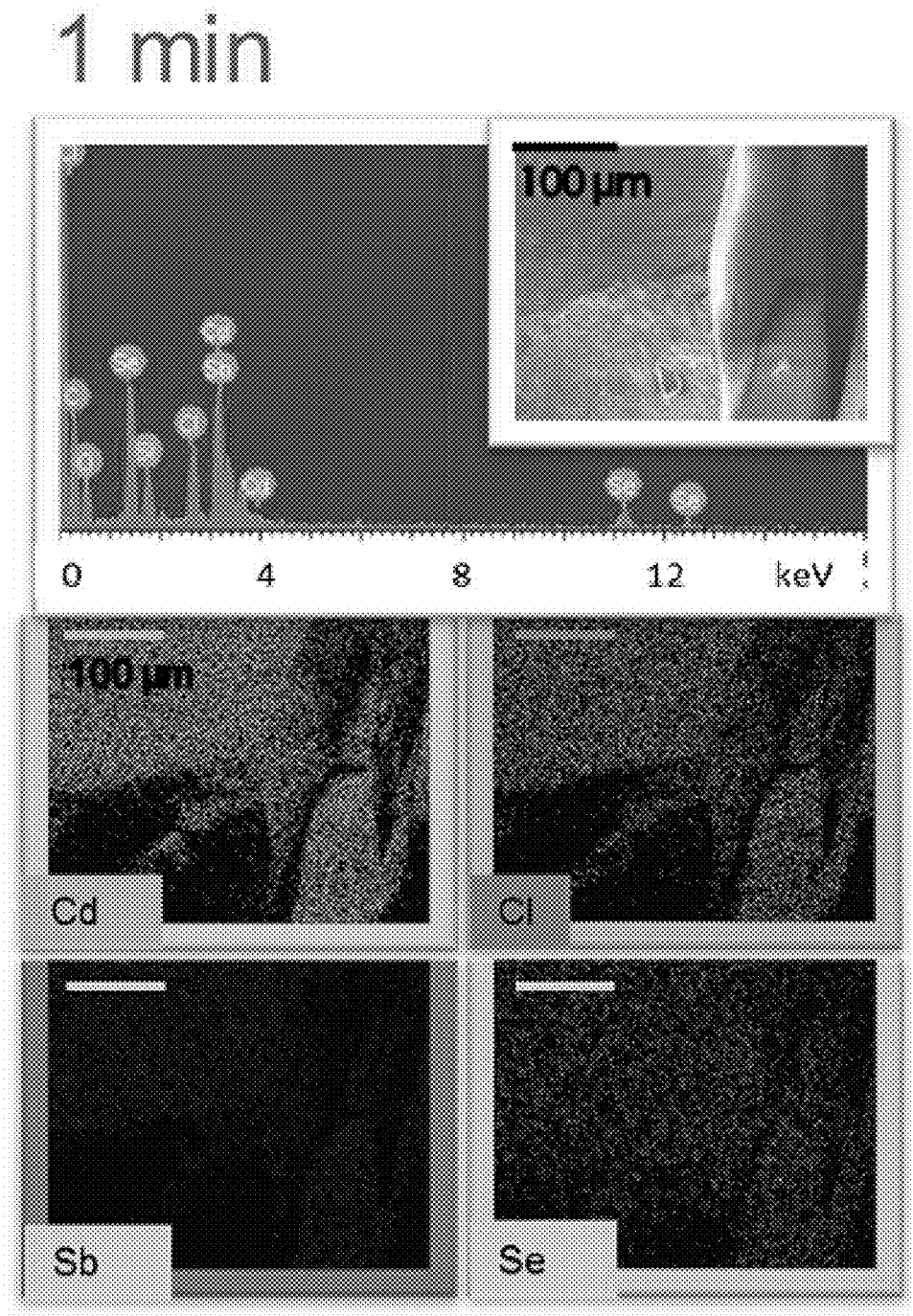
FIG. 13A and FIG. 13B show representative scanning electron micrographs, elemental spectra, and maps of CdSe quantum dots treated with $SbCl_3$ for 1 minute (FIG. 13A, scale bar: 100 μm) and for 12 hours (FIG. 13B, scale bar: 10 μm).
Figure 13B:
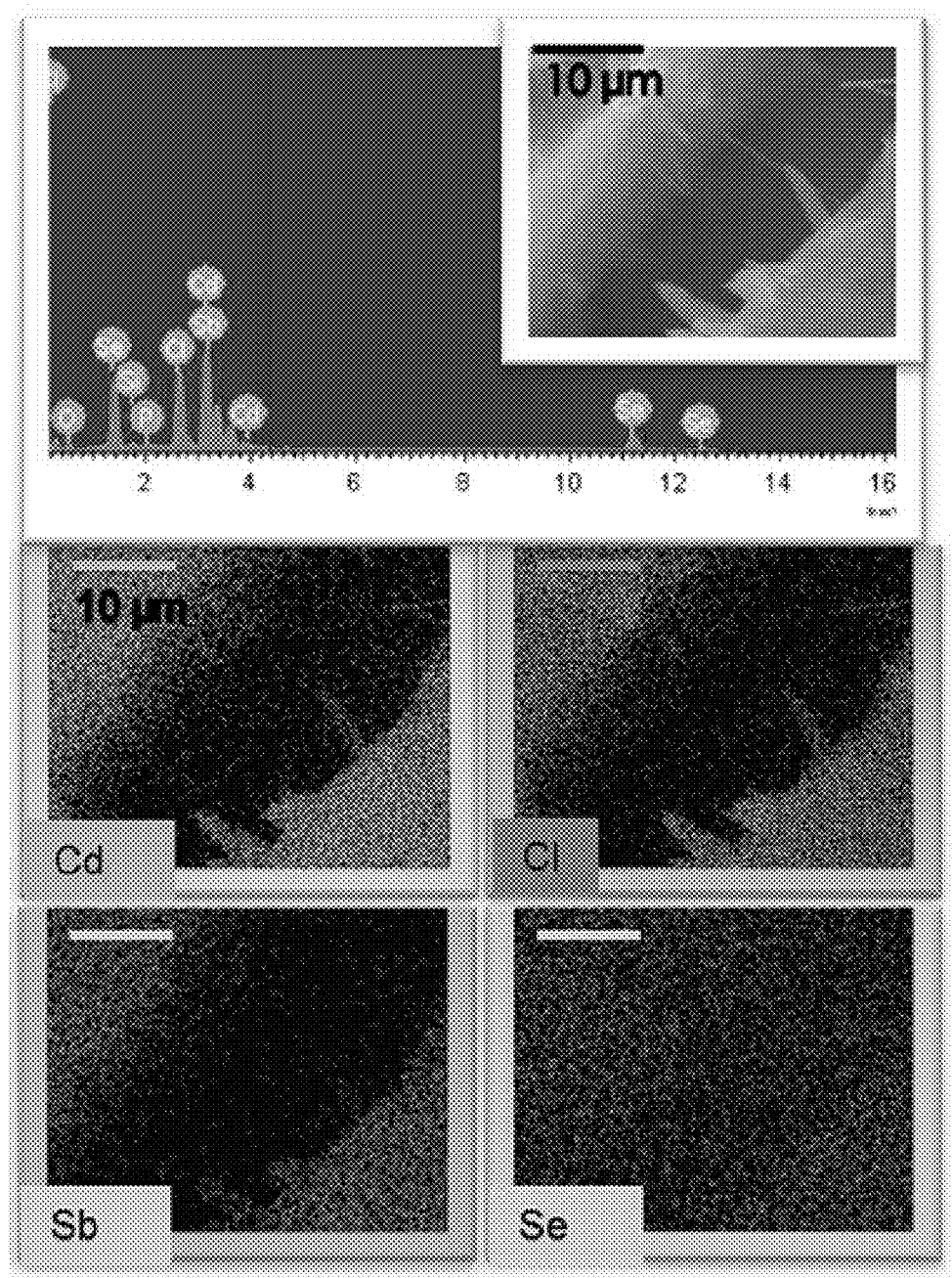

Referring to FIG. 13A and FIG. 13B, representative scanning electron micrographs, elemental spectra, and maps of CdSe quantum dots treated with $SbCl_3$ for 1 minute (FIG. 13A, scale bar: 100 μm) and for 12 hours (FIG. 13B, scale bar: 10 μm) are shown. As illustrated in FIG. 13A, the sample treated for 1 minute shows a large quantity of Cl associated with the CdSe agglomerates, indicating that $Cl^-$ may disrupt surface ligand during the initial reaction phase. As illustrated in FIG. 13B, the sample treated for 12 hours shows a co-localization of Cd and Cl within new filament-type structures and Sb and Sb overlapping within the agglomerate, revelatory of the second phase cation-exchange.

Figure 14:
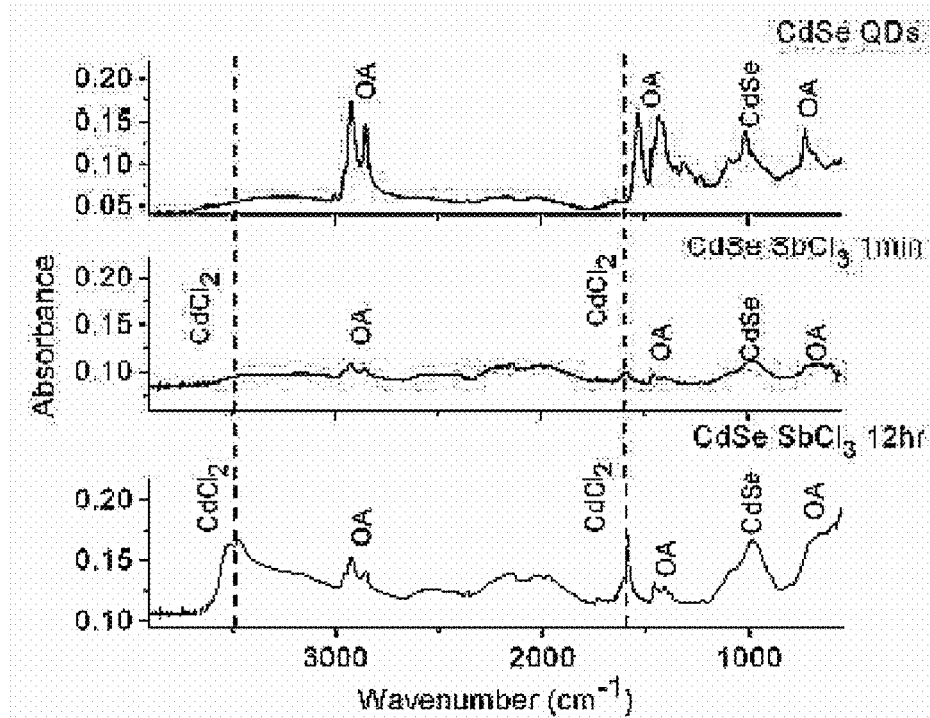
FIG. 14 shows a representative ATR-IR of CdSe quantum dots and CdSe quantum dots treated with $SbCl_3$ for 1 minute and for 12 hours, showing the disruption and partial loss of oleic acid followed by the production of $CdCl_2$ (dotted lines indicate $CdCl_2$ peak locations).
Figure 15:
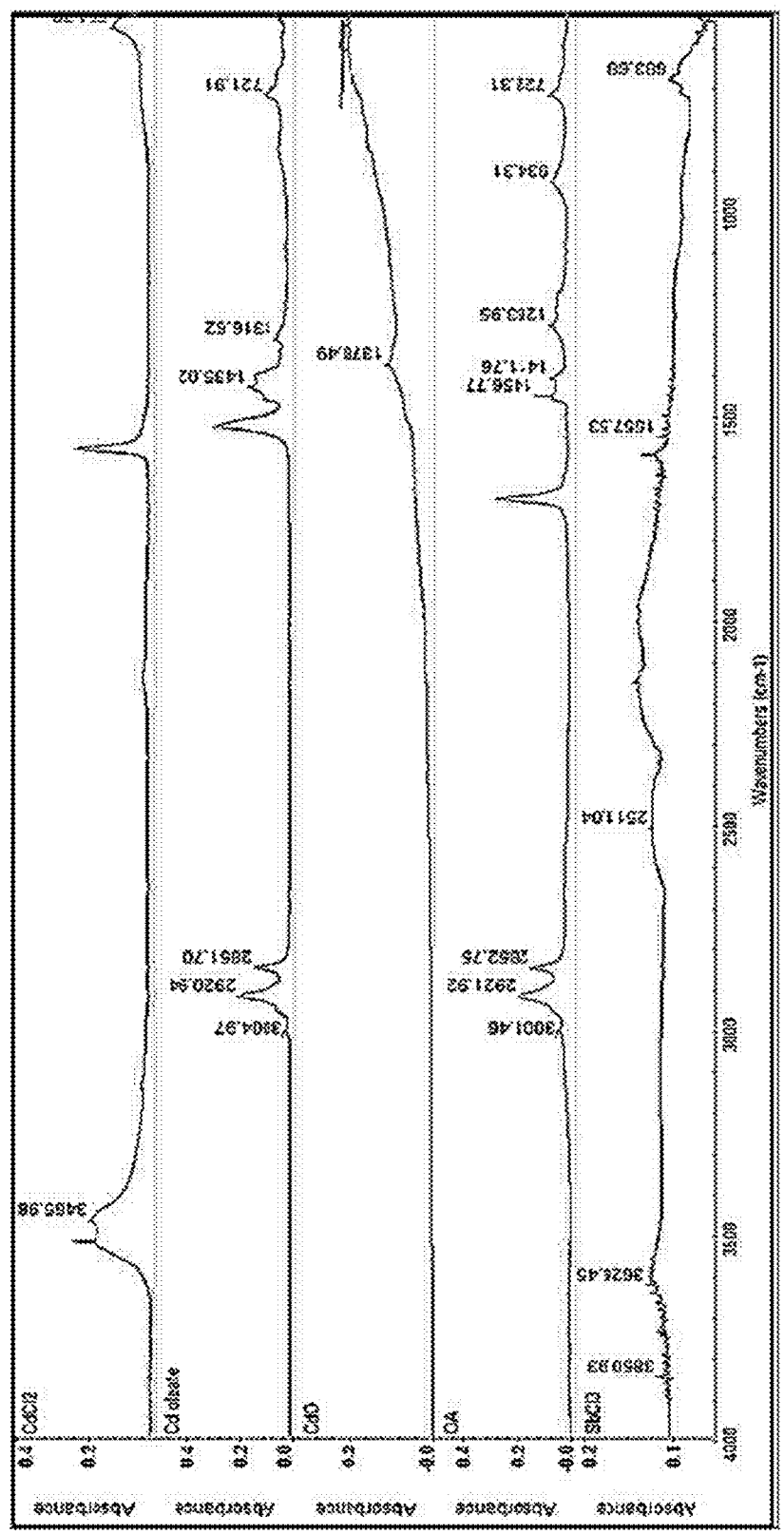
FIG. 15 shows a representative ATR-IR spectra of $CdCl_2$ (Fisher Scientific, ACS grade), Cd-oleate (synthesized as described below), CdO (STREM, 99.99%), oleic acid (OA, Sigma-Aldrich, 90%), and $SbCl_3$ (Aldrich, >99%).

The two-phase reaction mechanism was further supported by ATR-IR analysis (FIG. 14). ATR-IR absorption spectrum of CdSe QDs showed the expected peaks for CdSe capped with oleic acid as reported previously (Yu et al. (2003) Chem. Mater. 15: 2854-2860) with the extended scan showing the C—H stretches of oleic acid just below 3000 $cm^{-1}$. The spectra of CdSe QDs treated for 1 min with $SbCl_3$ displayed a material in transition with a pronounced decrease in the peak height and sharpness due to disruption and removal of some of the surface-capping oleic acid groups. The emergence of a small peak at 1588 $cm^{-1}$ foreshadowed the secondary reaction that produced $CdCl_2$, which was clearly seen in the sample treated for 12 h by the sharp peak at 1588 $cm^{-1}$ and the doublet centered at 3500 $cm^{-1}$. See ATR spectra of oleic acid, Cd-oleate, $SbCl_3$, and $CdCl_2$ in FIG. 15 for comparison. X-ray diffractograms (shown in FIG. 12A and FIG. 12B) of CdSe treated with $SbCl_3$ for 12 h confirm the retention of some CdSe and the production of $CdCl_2$ and also indicated that the produced $Sb_xSe_y$ is amorphous.

Figure 16:
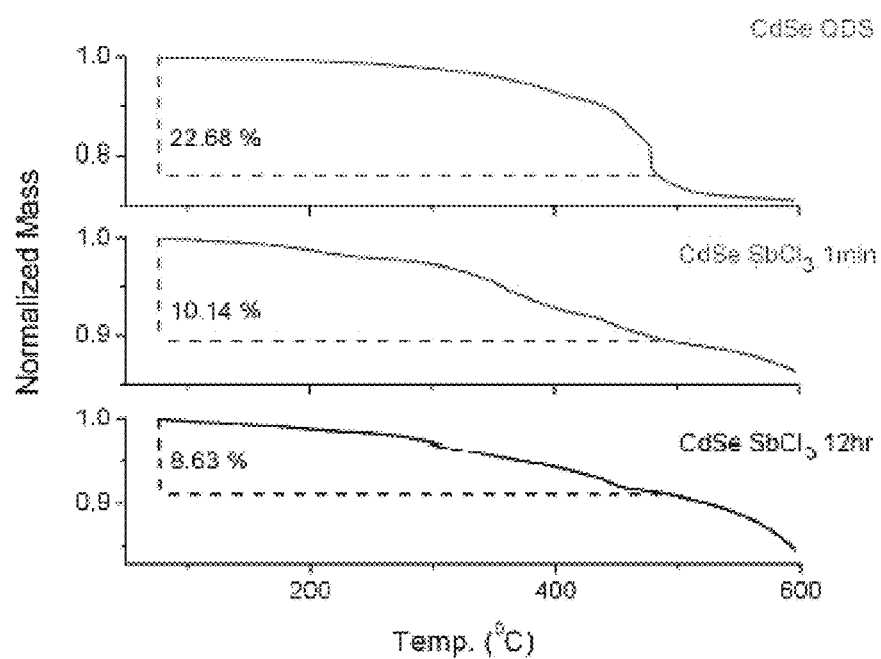
FIG. 16 shows representative TGA comparing untreated CdSe quantum dots to CdSe treated with $SbCl_3$ for 1 minute or 12 hours, revealing fewer ligands on the treated samples and production of $CdCl_2$.

TGA curves, displayed in FIG. 16, indicated mass loss for the untreated CdSe QDs began slowly at 220° C., peaked at 477° C., and plateaued at 530° C. Previous TGA studies (Khanna et al. (2010) J. Nanopart. Res. 12: 101-109) of CdSe QDs capped with organic ligands indicate a range comparable to the one observed here for the loss of surface ligands. QDs treated with $SbCl_3$ for 1 min and for 12 h displayed much lower mass loss within this initial temperature range due to the disruption and removal of the capping-oleic acid ligands by Cl. A second interval of mass loss starting at 490° C. was observed for the treated samples and was attributable to the sublimation of $CdCl_2$ (Dawar et al. (2013) J. Therm. Anal. Calorim. 112: 95-102).

Without wishing to be bound by theory, from the indicated two-phase reaction and formation of mesoscale superstructures, the observed nonzero net polarization response may be attributed to the exodus of $Cd^{2+}$ from CdSe QDs during treatment with $SbCl_3$ resulting in anisotropic, charge-imbalanced species. The assembly of nanoscale objects into large superstructures is key to mesoscale science, a branch of science wherein the broken symmetry of hierarchical structures is attributed to the generation of novel properties not observed in the nano- or bulk phases of the material (Weiss, P. S. (2014) ACS Nano 8(11): 11025-11026; Anderson (1972) Science 177(4047): 393-396).

Cation exchange is a versatile technique that has allowed the formation of a variety of nanostructures (Beberwyck et al. (2013) J. Phys. Chem. C 117: 19759-19770; Son et al. (2004) Science 306: 1009-1012; Casavola et al. (2012) Chem. Mater. 24(2): 294-302; Jia et al. (2014) Nat. Mater. 13(3): 301-307; Alivasatos, A. P. (2013) Chem. Mater. 25(12): 2544-2548; Li et al. (2012) ACS Nano 6(2): 1637-1647). Postsynthetic modification of nanostructures by tuning the ratio and nature of the cations has allowed manipulation of many of the properties of the nanostructures from photoluminescence (Li et al. (2012) ACS Nano 6(2): 1637-1647; Li et al. (2009) Angew. Chem., Int. Ed. 48(9): 1588-1591) to geometry (Casavola et al. (2012) Chem. Mater. 24(2): 294-302; Jain et al. (2010) J. Am. Chem. Soc. 132(29): 9997-9999). Here, a cation exchange is utilized to produce ferroelectric particles. The ferroelectric response is observable within 1 min of treatment and arises from the deviation of pyroelectric CdSe from its ideal near-stoichiometric ratio. As observed in the STEM-EDS maps, an exodus of Cd ions out of the quantum dots occurs.

Over time, $Sb^{3+}$ integrates within the resultant charge-imbalanced Se structures while the $Cd^{2+}$ reacts with $Cl^-$. However, energy dispersive X-ray spectroscopy and inductively coupled plasma optical emission spectroscopy indicate the ratio of Sb:Se is close to 0.4, well below the 0.67 needed for a charge-balanced compound. The unrequited charge imbalance and distortion of CdSe structure results in a highly anisotropic structure that demonstrates a nonzero net polarization. As discussed by Shaldin et al., when the composition of CdSe deviates from the ideal, defect centers form leading to local asymmetry (Shaldin et al. (2014) Semiconductors 48:1-8). From an atomistic point-of-view, Shaldin et al. discuss the introduction of local anisotropy within the crystal structure of CdSe. The basic structure is described as two deformed tetrahedral systems of $CdSe_4$ and $Cd_4Se$. If the central atom is changed, local symmetry remains unchanged and the inherent polarity of the two subsystems is retained. However, if the bases of the tetrahedral possess a vacancy or if an interstitial atom is introduced into the structure, the symmetry of the subsystem is lowered and three new vectors of polarization are introduced. The atomic defects within SbCl$_3$-treated CdSe QDs arise from the introduction of Cd vacancies and Sb$^{3+}$ interstitials which can result in the highly polarized, anisotropic structures.

Without wishing to be bound by theory, the dramatic decrease in the initial susceptibility (the linear portion starting at 0 V during the first sweep of the field response curves shown in FIG. 9) from the sample treated for 1 min to that of the sample treated for 12 h can be attributed to a disruption and slowing of ferroelectric domain nucleation and switching in the sample treated for 12 h due to the presence of Sb$_x$Se$_y$ and CdCl$_2$. The added materials can act, for example, as electronic defects preventing an even field distribution throughout the device and as physical barriers preventing tangential ferroelectric grains from coalescing or facilitating in turnover with one another. Thus, a larger coercive field may be necessary to generate the initial polarization alignment.

While the initial susceptibility is negatively impacted, the saturation polarization (maximum level of polarization achieved) increases from 96 to 120 µC/cm$^2$. Luby et al. discuss the electronic switching phenomena observed for amorphous samples of Sb$_x$Se$_y$; the analysis of current-voltage responses display a characteristic switch from high-resistivity to low-resistivity states from Sb$_x$Se$_y$ films (Luby et al. (1971) *Czech. J. Phys.* 21: 878-889). The switching is attributed to the generation of a conduction channel through the sample due to electrothermal processes. Anisotropic anomalies arising within layer structures are also a well-known phenomenon discussed extensively for Cd-containing layer-structures by Van der Valk et al. (Van der Valk et al. (1977) *Phys. Status Solidi B* 80: 321-332). Asymmetric coordination of anions with a highly charged cation produces polarization of the anions, for which, in an ideal octahedral complex of a metal ion surrounded by anions, the overlap repulsion and covalent bonding yield isotropic fields. However, introducing defects to the ideal octahedral yields an increased anisotropy that could contribute to the observed polarization effects in the samples.

While the intricacies of the reaction mechanism appear complex, the technique nonetheless generates a strong ferroelectric material with minimal energy cost. The ferroelectric particles are formed by a two phase reaction involving ligand displacement by chlorine anions followed by a cation exchange between cadmium and antimony. Using nanocrystals as starting materials enables one to leverage the massive variety of architectures, compositions, and shapes that already exist in the literature to possibly modulate the ferroelectric response or imbue it with additional properties such as tunable absorption, fluorescence, and ferromagnetism. Further, these particles will grant access to enhanced understanding of ferroelectric behavior and cation-exchange mechanisms at the nanoscale.

G. References

Alivisatos, A. P. *Chem. Mater.* 2013, 25 (12), 2544-2548.
Anderson, P. W. *Science* 1972, 177 (4047), 393-396.
Atkuri, H; et al.; *J Opt A: Pure Appl Opt.,* 2009, 11, 024006
Basun, S. A. et al. *Phys. Rev. B: Condens. Matter Mater. Phys.* 2011, 84, 024105/1-024105/8.
Beberwyck, B. J. et al. *J. Phys. Chem. C* 2013, 117, 19759-19770.
Bullen et al., *Nano Letters.* vol. 4, no. 12, pp. 2303-2307, 2004
Carrete, Alex et al. *J Am Chem Soc,* Just Accepted; DOI: 10.1021/ja4068639
Casavola, M. et al. *Chem. Mater.* 2012, 24 (2), 294-302.
Chang et al. *Materials Transactions,* 50(8), 2009, 2098
Chen et al., *Appl. Phys. Lett.* 2012, 101, pp 041908
Costas-Mora et al. Analytica Chimica Acta, 788, 2013, 114
Dawar, R. et al. *J. Therm. Anal. calorim.* 2013, 112, 95-102.
Dirin, D. N. et al. *J. Am. Chem. Soc.* 2014, 136, 6550-6553.
Garbovskiy, Y. et al. Emerging applications of ferroelectric nanoparticles in materials technologies, biology and medicine. *InTech* 2013, 475-497.
Garnett et al., *Journal of Physical Chemistry C,* vol. 112, pp. 12736-12746, 2008
Hiramatsu et al. *Chem. Mater.,* 2004, 16 (13), pp 2509-2511
Hines et al., *Adv. Mater.* (2003), 15 (21), 1844
Hong et al. US Patent App. Pub No. US 2012/0235080
Jain, P. K. et al. *J. Am. Chem. Soc.* 2010, 132 (29), 9997-9999.
Jia, G. et al. *Nat. Mater.* 2014, 13 (3), 301-307.
Joo et al., *J. Am. Chem. Soc.,* 2003, 125 (36), pp 11100-11105
Kamat, P. V. *Acc. Chem. Res.* 2012, 45, 1906-1915.
Khanna, P. K. et al. *J. Nanopart. Res.* 2010, 12, 101-109.
Koktysh et al. *Nanotechnology,* 2010, 21, 415601
Koktysh et al., *Mat. Science and Engineering,* 2010, 170, pp 117-122
Koktysh et al., *Nanotechnology,* 2011. V.22. 275606
Li, H. et al. *ACS Nano* 2012, 6 (2), 1637-1647.
Li, J. et al. *Angew. Chem.,* Int. Ed. 2009, 48 (9), 1588-91.
Liu et al., *Nanotechnology,* 2010, 21, 105707
Luby, S. et al. *Czech. J. Phys.* 1971, 21, 878-89.
Masumdar, E. U. et al. *Mater. Chem. Phys.* 2003, 77, 669-676.
Nann and Schneider Chem. Phys. Lett. 2004, 384, 150-152.
O'Brien, et al., *J. Phys. Chem. B,* 2005, 109 (30), pp 14314-14318
Owen, J. S. et al. *J. Am. Chem. Soc.* 2008, 130, 12279-12281.
Polking, Mark et al. Nature Materials, 2012, 11, 700.
Rai, Radheshyam; Sharma, Seema; Ceramics International, 2004, 30, 1295.
Ricinschi, D. et al. *Zairyo* 2006, 55, 169-172.
Rosenthal et al. *Surf. Sci. Rep.,* vol. 62, no. 4, pp. 111-157, 2007
Salamazo et al. ICAM 2009 abstract
Schreuder, M. A. et al. *J. Phys. Chem. C* 2009, 113, 8169-8176.
Schreuder, M. A. et al. *Nano Lett.* 2010, 10, 573-576.
Schmidt, M. E. et al. *J. Chem. Phys.* 1997, 106, 5254-5259.
Shaldin, Y. V. et al. *Semiconductors* 2014, 48, 1-8.
Son, D. H. et al. *Science.* 2004, 306, 1009-1012.
Sun, X. et al. *J. Am. Chem. Soc.* 2014, 136, 1706-1709.
Susrutha et al. J. of Nanofluids, 1, 2012, 120
Thanassoulas, Angelos et al. Phys Rev E, 2013, 88, 032504
Torimoto et al., *Chem. Commun.,* 2010, 46, 2082-2084
Ung, T. D. T. et al. *Adv. Nat. Sci.: Nanosci. Nanotechnol.* 2012, 3 (043001), 11.
Van der Valk and Haas, C. *Phys. Status Solidi B* 1977, 80, 321-32.
Varghese, Justin et al. J. Mater. Chem. C, 2013, 1, 2618

Wang, C. et al. *Appl. Phys. Lett.* 2011, 98, 192901/1-192901/3.
Weiss, P. S. *ACS Nano* 2014, 8 (11), 11025-11026.
Weller, H. et al. *Z. Phys. Chem.* 2014, 228, 183-192.
Xu, Y.; et al.; *Ferroelectrics,* 1999, 230, 11.
Yadav, A. A. et al. *Chalcogenide Lett.* 2008, 5, 405-414.
Yu et al., *J. Am. Chem. Soc.* 2011, 133, pp 11014-11017
Yu, W. W. et al. *Chem. Mater.* 2003, 15, 2854-2860.
Zhang, H. *Condens. Matter* 2012, 1-18.
Zhong, et al., *J. Mater. Chem.* 2004, 14, pp 2790-2794
Vongsavat, et al., *ACS Appl. Mater. Interfaces,* 2011, 3 (9), pp 3616-3624
Xue, et al., *Angewandte Chemie* 2007, 119)44) pp 8588-8591
Ying, et al., *PLoS ONE* 3(5): e2222, 2008
U.S. Pat. No. 8,558,214
U.S. Pat. No. 8,153,470
U.S. Published Patent Application 2013/0240871
U.S. Published Patent Application 2013/0140505
U.S. Published Patent Application 2012/0329686
U.S. Published Patent Application 2012/0145212
U.S. Published Patent Application 2011/0133175
U.S. Published Patent Application 2010/0167512
International Published Patent Application WO 2013002919A1
International Published Patent Application WO 2012111009A2
International Published Patent Application WO 2012/158847.

It will be apparent to those skilled in the art that various modifications and variations can be made in the present invention without departing from the scope or spirit of the invention. Other aspects of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An agglomerate comprising:
   (a) a particle having a body, wherein the body comprises antimony and a first atom;
   (b) a matrix comprising a halogen and a second atom; and
   (c) a surface ligand bound to the particle,
   wherein the particle is at least partially embedded in the matrix,
   wherein the first atom and the second atom are independently selected from Cd, Se, Pb, S, Fe, O, Au, Ag, Te, In, Sn, Eu, Ti, and Ba; and
   wherein the agglomerate is ferroelectric.

2. The agglomerate of claim 1, wherein the halogen is Cl or I.

3. The agglomerate of claim 1, wherein the body further comprises CdSe, PbS, $Fe_3O_2$, Au, CdTe—CdS, Ag, ZnO, Au, $AgInS_2$—ZnS, ZnCuInS—ZnS, SnS, EuS, or CdSe—ZnS, or a combination thereof.

4. The agglomerate of claim 1, wherein the first atom is Se.

5. The agglomerate of claim 1, wherein the second atom is Cd.

6. The agglomerate of claim 1, wherein the surface ligand is selected from $(R^1)_m$-alkyl, $(R^1)_m$-alkenyl, $(R^1)_m$-alkynyl, and $(R_1)_m$-peptide, and is substituted with 0, 1, 2, or 3 groups selected from aryl, cycloalkyl, cycloalkenyl, heterocyclyl, heteroaryl, -alkyl-aryl, -alkenyl-aryl, alkynyl-aryl, -alkyl-cycloalkyl, -alkenyl-cycloalkyl, alkynyl-cycloalkyl, alkyl-heterocyclyl, -alkenyl-heterocyclyl, alkynyl-heterocyclyl, -alkyl-heteroaryl, -alkenyl-heteroaryl, alkynyl-heteroaryl, alkyl, alkenyl, alkynyl, haloalkyl, haloalkenyl, haloalkynyl, alkoxy, aryloxy, mono- or di-alkylamino, a mono- or diaryl amino, hydroxyl, thiol, nitro, cyano, amino, halo, —C(O)O—$R^2$, —C(O)—$R^2$, —$COR^2$, and —$OR^2$;
   wherein each $R^1$ is independently selected from —COOH, —$NH_2$, —SH, —$Si(R^3)_3$, and —$PO(OR^4)_2$;
   wherein each $R^2$ is independently selected from hydrogen, alkyl, haloalkyl, polyhaloalkyl, alkylamino, dialkylamino, -alkyl-aryl, and -alkyl-heterocyclyl;
   wherein each $R^3$ is independently selected from hydrogen, halogen, and alkyl;
   wherein each $R^4$ is independently selected from hydrogen, alkyl, and aryl; and
   wherein m is 1, 2, 3, 4, or 5.

7. The agglomerate of claim 1, wherein the surface ligand is selected from oleic acid, oleylamine, citrate, cysteamine, glutathione, and mercaptoundecanoic acid.

8. The agglomerate of claim 1, wherein the agglomerate has a diameter from 4 nm to 50 µm.

9. The agglomerate of claim 1, wherein the agglomerate comprises two or more particles.

10. The agglomerate of claim 1, wherein the particle is a nanoparticle.

11. The agglomerate of claim 1, wherein the particle is fluorescent or radioactive.

12. The agglomerate of claim 1, wherein the first atom is an anion.

13. The agglomerate of claim 1, wherein the second atom is a cation.

14. The agglomerate of claim 1, wherein the first atom and the second atom are the same type of atom.

15. The agglomerate of claim 1, wherein the first atom is Se, and wherein the first atom and antimony together form $Sb_2Se_3$.

16. The agglomerate of claim 1, wherein the body further comprises CdSe.

17. The agglomerate of claim 1, wherein the matrix is a semi-crystalline matrix.

18. The agglomerate of claim 1, wherein the halogen is Cl, wherein the second atom is Cd, and wherein the halogen and the second atom together form $CdCl_2$.

19. The agglomerate of claim 1, wherein the surface ligand is an organic surface ligand.

20. The agglomerate of claim 1, wherein the particle is a nanoparticle, wherein the first atom is Se, wherein the body further comprises CdSe, wherein the second atom is Cd, wherein the surface ligand is an organic surface ligand, wherein the matrix is semi-crystalline, and wherein the halogen is Cl.

* * * * *